(12) United States Patent
Bittner et al.

(10) Patent No.: US 10,538,724 B2
(45) Date of Patent: Jan. 21, 2020

(54) DEFECT REDUCTION RINSE SOLUTION CONTAINING AMMONIUM SALTS OF SULFOESTERS

(71) Applicant: BASF SE, Ludwigshafen (DE)

(72) Inventors: Christian Bittner, Bensheim (DE);
Guenter Oetter, Frankenthal (DE);
Andrei Honciuc, Waedenswil (CH);
Andreas Klipp, Lambsheim (DE);
Simon Braun, Mannheim (DE)

(73) Assignee: BAFS SE, Ludwigshafen (DE)

( * ) Notice: Subject to any disclaimer, the term of this patent is extended or adjusted under 35 U.S.C. 154(b) by 173 days.

(21) Appl. No.: 15/743,848

(22) PCT Filed: Jul. 1, 2016

(86) PCT No.: PCT/EP2016/065474
§ 371 (c)(1),
(2) Date: Jan. 11, 2018

(87) PCT Pub. No.: WO2017/009068
PCT Pub. Date: Jan. 19, 2017

(65) Prior Publication Data
US 2018/0201885 A1    Jul. 19, 2018

(30) Foreign Application Priority Data
Jul. 16, 2015   (EP) .................................. 15176949

(51) Int. Cl.
*C11D 11/00*   (2006.01)
*C11D 1/12*    (2006.01)
(Continued)

(52) U.S. Cl.
CPC .......... *C11D 11/0047* (2013.01); *C11D 1/123* (2013.01); *G03F 7/40* (2013.01); *G03F 7/425* (2013.01); *G03F 7/426* (2013.01)

(58) Field of Classification Search
CPC .................................................. C11D 11/0047
(Continued)

(56) References Cited

U.S. PATENT DOCUMENTS

| 3,577,348 A | 5/1971 | Clementson et al. |
| 4,072,632 A * | 2/1978 | Reed .................... C11D 1/123 |
| | | 510/235 |

(Continued)

FOREIGN PATENT DOCUMENTS

| GB | 1 527 020 A | 10/1978 |
| JP | 2009-167327 A | 7/2009 |

(Continued)

OTHER PUBLICATIONS

International Search Report dated Oct. 5, 2016, in PCT/EP2016/065474 filed Jul. 1, 2016.

(Continued)

*Primary Examiner* — Gregory E Webb
(74) *Attorney, Agent, or Firm* — Oblon, McClelland, Maier & Neustadt, L.L.P.

(57) ABSTRACT

The present invention relates to the use of a composition comprising one or more ammonium salt(s) of one or more compounds selected from the group consisting of sulfobutanedioic acid diester(s), (sulfomethyl)-butanedioic acid diester(s), methyl-sulfobutanedioic acid diester(s), sulfoglutaric acid diester(s), and sulfotricarballic acid triester(s), for cleaning or rinsing a product comprising a substrate and supported thereon a patterned material layer having line-space structures with a line width of 50 nm and below. The invention also relates to a corresponding method of making a cleaned or rinsed product comprising a substrate and supported thereon a patterned material layer having line-space structures with a line width of 50 nm or below. The invention also relates to a solution with color of HAZEN (Continued)

Figure 1:
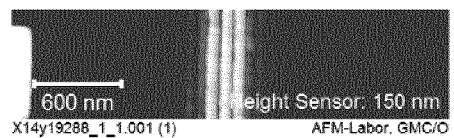

number below 1000 and/or a turbidity in the range of from 0.08 to 10 NTU, wherein the solution comprises water and one or more ammonium salt(s) and optionally one or more organic solvent compounds. The invention also relates to a method of making a corresponding solution.

21 Claims, 1 Drawing Sheet

(51) Int. Cl.
*G03F 7/42* (2006.01)
*G03F 7/40* (2006.01)

(58) Field of Classification Search
USPC ........................................................ 510/175
See application file for complete search history.

(56) References Cited

U.S. PATENT DOCUMENTS

| | | | |
|---|---|---|---|
| 4,267,212 A | | 5/1981 | Sakawaki |
| 4,291,117 A | | 9/1981 | Ohishi et al. |
| 4,784,800 A | * | 11/1988 | Leng ................ C11D 1/123 510/403 |
| 5,891,839 A | * | 4/1999 | Erilli ............... C11D 17/0021 510/424 |
| 9,783,730 B2 | | 10/2017 | Langlotz et al. |
| 2010/0152081 A1 | | 6/2010 | Hierse et al. |
| 2013/0225464 A1 | | 8/2013 | Harada et al. |
| 2015/0323871 A1 | | 11/2015 | Klipp et al. |
| 2017/0101576 A1 | | 4/2017 | Langlotz et al. |

FOREIGN PATENT DOCUMENTS

| | | |
|---|---|---|
| WO | 2004/044092 A1 | 5/2004 |
| WO | 2009/124922 A1 | 10/2009 |
| WO | 2012/101545 A1 | 8/2012 |
| WO | 2012/134226 A2 | 10/2012 |
| WO | 2014/091363 A1 | 6/2014 |

OTHER PUBLICATIONS

European Office Action dated Feb. 29, 2016 in European Application 15 176 949.4.
European Search Report dated Feb. 3, 2016 in European Application 15 176 949.4.
U.S. Appl. No. 14/060,967, filed May 1, 2014, 2014/0116689 A1, Bittner et al.
U.S. Appl. No. 15/115,500, filed May 11, 2017, 2017/0130153 A1, Peretolchin et al.
U.S. Appl. No. 15/124,959, filed Jan. 19, 2017, 2017/0015894 A1, Bittner et al.
U.S. Appl. No. 15/527,249, filed Dec. 14, 2017, 2017/0355897 A1, Bittner et al.

* cited by examiner

DEFECT REDUCTION RINSE SOLUTION CONTAINING AMMONIUM SALTS OF SULFOESTERS

The present invention relates to the use of a composition comprising one or more ammonium salt(s) of one or more compounds selected from the group consisting of sulfobutanedioic acid diester(s), (sulfomethyl)-butanedioic acid diester(s), methyl-sulfobutanedioic acid diester(s), sulfoglutaric acid diester(s) and sulfotricarballic acid triester(s) for cleaning or rinsing a product comprising a substrate and supported thereon a patterned material layer having line-space structures with a line width of 50 nm or below. The invention also relates to a corresponding method of making a cleaned or rinsed product comprising a substrate and supported thereon a patterned material layer having line-space structures with a line width of 50 nm or below. The invention also relates to a formulation with color of HAZEN number below 1000 and/or a turbidity in the range of from 0.08 to 10 NTU, wherein the formulation comprises water and one or more ammonium salt(s) and optionally one or more organic solvent compounds. The invention also relates to a method of making a corresponding formulation. The invention is defined in the claims and subsequently its specific embodiments are described herein below in more detail.

The present invention is defined in the claims as attached and in the description. If not stated otherwise, preferred aspects of the present invention are meant for combination with other preferred aspects of the present invention.

In the process of manufacturing integrated circuits (ICs) with large-scale integration (LSI), very-large-scale integration (VLSI) and ultra-large-scale integration (ULSI), patterned material layers like patterned photoresist layers, patterned barrier material layers containing or consisting of titanium nitride, tantalum or tantalum nitride, patterned multi-stack material layers containing or consisting of stacks e.g. of alternating polysilicon and silicon dioxide layers, and patterned dielectric material layers containing or consisting of silicon dioxide or low-k or ultra-low-k dielectric materials are produced by photolithographic techniques. Nowadays, such patterned material layers comprise structures of dimensions even below 22 nm with high aspect ratios. The before-mentioned specifications also apply for the present invention defined herein below.

Photolithography is a method in which a pattern cut into a mask is projected onto a substrate such as a semiconductor wafer. Semiconductor photolithography typically includes the step of applying a layer of a photoresist on a top surface of the semiconductor substrate and exposing the photoresist to actinic radiation, in particular UV radiation of a wavelength of, for example, 193 nm, through the mask. The before-mentioned principles also apply to the present invention described herein below. In order to extend the 193 nm photolithography to the 22 nm and the 15 nm technology node, immersion photolithography has been developed as a resolution enhancement technique. In this technique, the air gap between the final lens of the optical system and the photoresist surface is replaced by a liquid medium that has a refractive index greater than one, e.g. ultrapure water with a refractive index of 1.44 for the wavelength of 193 nm. This technique can also be applied in a process according to the present invention or be used with a composition or formulation of the present invention as described herein below. However, in order to avoid leaching, water-uptake and pattern degradation, a barrier coating or a water resistant photoresist must be used.

Beside the 193 nm-immersion lithography other illumination techniques with significant shorter wavelength are considered to be solutions to fulfil the needs of further down-scaling of the feature sizes to be printed of 20 nm node and below. Beside e-Beam exposure the Extreme Ultraviolet Lithography (EUV) with a wavelength of approx. 13.5 nm seem to a promising candidate to replace immersion lithography in the future. After exposure to actinic radiation the subsequent process flow is independent of the photolithographic method used (e.g. UV lithography, immersion photolithography or EUV lithography as described above) and can therefore be used in processes according to the present invention described herein below.

Typically, structures with high aspect ratios and a structure having a width of 50 nm or below are produced by directing an intense light beam through an optical mask onto a photoresist (chemically deposited layer on the substrate). The basic procedure of a photolithographic process is typically divided into a number of process steps, e.g. in many cases and situations the following process steps are distinguished (but it has to be noted that in other cases process steps might be omitted, amended or inserted in addition to the process steps listed):

1. Cleaning of the wafer
2. Preparation
3. Photoresist Application
4. Exposure and Post-Exposure Bake
5. Developing and Rinsing
6. Hard-bake
7. Follow-up process, e.g. Plasma Etching Subsequent process steps for device manufacturing typically follow.

The method and the use according to the present invention is preferably part of a process of making a cleaned or rinsed product comprising a substrate and supported thereon a patterned material layer comprising one or all of the process steps discussed above. With respect to the basic process of a photolithographic process as disclosed above, the present invention (use, method and formulation) relates to process step 6.

In process step 1 (cleaning of the wafer), different chemical treatments are applied to the surface of the wafer so that substances absorbed on the surface of the wafer (contaminations) are removed.

In process step 2 (preparation), the wafer is heated to at least 150° C. in order to remove moisture absorbed on the surface, optionally followed by a treatment with hexamethyldisilazane (HMDS) in order to passivate ("hydrophobize") the surface (capping remaining OH-groups with methyl-groups). A passivated surface serves the purpose of preventing water from diffusing in between the wafer surface and the photoresist layer at a later stage of the photolithographic process.

In process step 3 (photoresist application), a photoresist layer is deposited onto the wafer by spin coating. A detailed description and discussion of this process step is disclosed in U.S. Pat. No. 4,267,212 A. The thickness of this layer can vary from some 10 nm for EUV resist to some 100 nm for DUV resist and can reach up to a few micrometer for older resists and micromachining applications. After evaporation of the solvent, the deposited photoresist layer is optionally pre-baked at temperatures typically at around 100° C.

In process step 4, an intense light beam is directed through an optical mask so that only specific spots of the photoresist layer are exposed to the light. Depending on the nature of the photoresist (positive or negative) the exposed or the unexposed regions of the photoresist are removed in the next process step (developing). A post-exposure bake is often performed to help with the chemical amplification of the resist.

In process step 5 (developing and rinsing) and according to the present invention, a developer solution is brought in contact with the photoresist to remove the (un-)exposed regions of the photoresist layer. A patterned photoresist layer corresponding to the pattern of the optical mask (negative or positive) thus remains on the wafer (substrate). A typical developer solution contains tetramethylammoniumhydroxid (TMAH) for positive tone resists and organic solvents for negative tone resists.

After a suitable time for the developer solution on the resist the rinsing composition is applied (wet-to-wet) to prevent, remove, or alleviate specific defects (e.g. watermark defects, remaining residuals from the developer solution, pattern collapse). Optionally it is also possible to have an additional water rinse step between the developer solution and the rinse formulation. The application of the rinsing composition is of particularly high relevance with respect to the products having line-space structures with a small line width and high aspect ratio. The substrate is then typically spin dried after which the substrate is transferred to the next process step.

In process step 6 (hard bake) the wafer as supporting the patterned photoresist layer can optionally be "hard-baked", typically at a temperature of 120-180° C. After the hardbake, the remaining photoresist layer has solidified and is thus more resistant to chemical treatments and/or physical stress.

Follow-up process step 7 (e.g. plasma etching) transfers the targeted architecture of the photoresist into the wafer substrate. The etching step typically removes the dielectric and/or hardmask layer (silicon oxide or low-k layer between the photoresist layer and the wafer (e.g. silicone oxide, titanium nitride, low-k layer (carbon doped silicon oxide)).

However, irrespective of the exposure techniques, the wet chemical processing of small pattern involves a plurality of problems. As technologies advance and dimension requirements become stricter and stricter, photoresist patterns are required to include relatively thin and tall structures or features of photoresists, i.e., features having a high aspect ratio, on the substrate. These structures may suffer from bending and/or collapsing, in particular, during the cleaning or rinsing process, due to excessive capillary forces of the liquid or solution remaining from the cleaning or rinsing solution between adjacent photoresist features, in particular during the spin dry processes. The maximum stress σ between small features caused by the capillary forces can be described according to Namatsu et al. Appl. Phys. Lett. 66(20), 1995 as follows:

$$\sigma = \frac{6 \cdot \gamma \cdot \cos\theta}{D} \cdot \left(\frac{H}{W}\right)^2$$

wherein γ is the equilibrium surface tension of the fluid, θ is the contact angle of the fluid on the substrate having supported thereon the patterned material layer, D is the distance between the features of the patterned material layer (also called "space"), W is the width of the features of the patterned material layer (line width), and H is the height of the features of the patterned material layer (the parameters H and W determine the aspect ratio).

One approach to lower the maximum stress σ for the cleaning and rinse step may include using a photoresist with modified polymers to make it more hydrophobic. However, this approach may decrease the wettability of the photoresist pattern by the rinse and cleaning solution.

In another approach to lower the maximum stress, the surface tension γ of the fluid (both dynamic and equilibrium surface tension) has to be decreased. In order to decrease the surface tension of a fluid or a liquid surfactants are usually added to said fluid or liquid.

Another problem of the conventional photolithographic process is line edge roughness (LER) and line width roughness (LWR) due to resist and optical resolution limits. LER includes horizontal and vertical deviations from the feature's ideal form. In particular, as critical dimensions shrink the LER becomes more problematic and has negative effects, such as an increased transistor leakage current, thus lowering the performance of the IC device.

Due to the shrinkage of the dimensions, the removal of particles becomes a critical factor in order to achieve a defect reduction. The latter also applies to photoresist patterns as well as to other patterned material layers, which are generated during the manufacture of optical devices, micromachines and mechanical precision devices.

An additional problem of the conventional photolithographic process is the presence of watermark defects. Watermarks may form on the photoresist as the deionized water or defect rinse solution cannot be spun off from the hydrophobic surface of the photoresist. The watermarks have a harmful effect on yield and IC device performance.

Yet another problem is the occurrence of so called "Blob Defects". These defects are caused during UV exposure and/or photoresist development and have often the form of a round "crater-like" opening on one or more of the top layers on the photoresist, e.g. polymeric and photosensitive layers. Small particles or other insoluble matter can be trapped in those opening and result in inefficient particle removal or blocking of the openings. In particular hydrophobic fragments or aggregates of hydrophobic molecules can be absorbed in or on those defect sides. These remaining particles, fragments or aggregates cause problems at a later process stage.

Another problem of the conventional photolithographic process is the absorbance of solvents by the photoresist layer or the patterned material layer resulting in swelling of these layers. Patterns in very close proximity, in particular patterns having line-space structures with a line width of 50 nm or below, thus get into direct contact with each other after swelling. Furthermore, the swollen patterns in direct contact to each other will subsequently stick together even after developing, cleaning or rinsing of the product, in particular products according to the present invention. Photoresist swelling thus limits the minimum achievable line-space dimensions of a product, in particular for products according to the present invention.

Correspondingly, it was a primary object of the present invention to provide for a composition that can be used for cleaning or rinsing a product comprising a substrate and supported thereon a patterned material layer having linespace structures with a line width of 50 nm or below. The use of said composition should preferably allow for the prevention of pattern collapse, the reduction of line edge roughness, prevention or reduction of water mark defects, prevention or reduction of photoresist-swelling, prevention or reduction of blob defects, and/or particle removal.

Correspondingly, it was a further object of the present invention to provide for a corresponding method of making a cleaned or rinsed product comprising a substrate and supported thereon a patterned material layer having line-space structures with a line width of 50 nm or below.

Correspondingly, it was a further object of the present invention to provide for a corresponding formulation with a color of HAZEN number below 1000 and/or a turbidity in the range of from 0.08 to 10 NTU.

WO 2012/101545 A1 relates to the "Use of surfactants having at least three short-chain perfluorinated groups for manufacturing integrated circuits having patterns with line-space dimensions below 50 nm" (title). The surfactant comprises a "hydrophilic group" and a "hydrophobic group". Sodium salts of a sulfonic acid are disclosed as possible hydrophilic groups. Furthermore, a photolithographic process is disclosed comprising the step of applying a chemical rinse solution to the developed patterned photoresist layer.

WO 2014/091363 A1 relates to the "Use of compositions comprising a surfactant and a hydrophobizer for avoiding anti pattern collapse when treating patterned materials with line-space dimensions of 50 nm or below" (title). 2-sulfosuccinic acid esters are disclosed as surfactants and a "quaternary alkyl ammonium compound" is disclosed as "hydrophobizer". Furthermore, a method is disclosed for manufacturing integrated circuits devices, optical devices, micromachines and mechanical precision devices.

WO 2004/044092 A1 relates to "Fluorinated surfactants for aqueous acid etch solutions" (title). Salts of sulfonic acid are disclosed as surfactants.

US 2010/0152081 A1 relates to "Fluorosurfactants" (title). Compounds having an aryl sulfonate group are disclosed as "surface-active compounds".

U.S. Pat. No. 4,072,632 relates to "dishwashing compositions" (title).

U.S. Pat. No. 4,784,800 relates to "detergent compositions" (title).

GB 1 527 020 relates to "the preparation of dialkyl sulphosuccinates" (title).

U.S. Pat. No. 3,577,348 relates to a "trichlorotrifluoroethane water emulsion system" (title).

US 2013/0225464 A1 relates to a "cleaning liquid for semiconductor device substrates and [a] cleaning method" (title).

U.S. Pat. No. 4,291,117 relates to a "plate making process with novel use of surfactant" (title).

WO 2012/134226 A2 relates to a "cleaning-solution composition for photolithography" (title).

According to the present invention, the primary technical problem as defined above is solved by the use of a composition comprising one or more ammonium salt(s) of one or more compounds selected from the group consisting of sulfobutanedioic acid diester(s),
(sulfomethyl)-butanedioic acid diester(s),
methyl-sulfobutanedioic acid diester(s),
sulfoglutaric acid diester(s),
and
sulfotricarballic acid triester(s), for cleaning or rinsing a product comprising a substrate and supported thereon a patterned material layer having line-space structures with a line width of 50 nm and below.

Herein and in the context of the present invention, the term "sulfobutanedioic acid" also refers to "sulfosuccinic acid" and the term "sulfosuccinate" refers to a deprotonated form of "sulfobutanedioic acid", preferably the term "sulfosuccinate" refers to "sulfobutanedioic acid, wherein the sulfonic acid group is deprotonated".

Herein and in the context of the present invention, the term "patterned material layer" refers to a layer supported on a substrate. The supported layer has a specific pattern having line-space structures with a line width of 50 nm and below wherein the supporting substrate is, e.g., a semiconductor wafer. In the product comprising a substrate and supported thereon a patterned material layer having line-space structures with a line width of 50 nm and below (i.e. in the product which is subject to the treatment according to the present invention) the ratio of the line width to the width of space between two adjacent lines is preferably lower than 1:1, more preferably lower than 1:2. Patterned material layers having such a low "line-width-to-space-width" ratio are known by the skilled person to require a very delicate handling during production.

The line width of line-space structures of a patterned material layer can readily be determined by scanning electron microscopy, in particular by scanning electron microscopy with a Hitachi CG 4000.

Typically, a patterned material layer that is subject to the treatment according to the present invention is formed by deposition of a polymeric photoresist onto a support and subsequent exposure of the supported photoresist layer to actinic radiation through a mask. After developing the exposed photoresist layer with a developer solution a patterned material layer results.

In some cases, a post-exposure bake (PEB) is conducted before developing with a developer solution.

A typical developer solution is, e.g., an aqueous solution comprising tetramethylammonium hydroxide (TMAH) (see WO 2014/091363, p. 23, l. 10).

The synthesis of the compounds used according to the present invention (i.e., ammonium salt(s) of one or more sulfobutanedioic acid diester(s), (sulfomethyl)-butanedioic acid diester(s), methyl-sulfobutanedioic acid diester(s), sulfoglutaric acid diester(s), sulfotricarballic acid triester(s)) typically comprises the addition of $NaHSO_3$, $KHSO_3$, $NH_4HSO_3$ or $(Me_3NCH_2CH_2OH)HSO_3$ to the C—C double bond of an α,ß-unsaturated carboxylic ester group (optionally followed by an ion exchange step). Preferred synthetic methods of preparing the compounds used according to the present invention are described in more detail in the examples herein below.

Surprisingly, compositions comprising one or more ammonium salt(s) as defined above are particularly suitable for cleaning or rinsing a product comprising a substrate and supported thereon a patterned material layer having line-space structures with a line width of 50 nm or below. Furthermore, products comprising a substrate and supported thereon a patterned material layer, which have been cleaned or rinsed with a composition as defined above, exhibit fewer residues on the surface of the supporting substrate and/or the supported patterned material layer than those cleaned or rinsed with compositions known in the prior art. Moreover, cleaning or rinsing with a formulation of the present invention prevents (or reduces) pattern collapse. Thus compositions as defined above are thus valuable in industry as they increase the production efficiency of the production of ICs.

When cleaning or rinsing a product comprising a substrate and supported thereon a patterned material layer having line-space structures with a line width of 50 nm and below, the use according to the present invention of a composition as defined above comprising an ammonium cation selected from the group consisting of protonated ammonia ($NH_4^+$), primary ammonium, secondary ammonium, tertiary ammonium, and quaternary ammonium is preferred.

Also preferred is the use according to the present invention of a composition as defined above, wherein the one or at least one of the more than one ammonium salt(s) comprises a primary ammonium, secondary ammonium, tertiary ammonium, or quaternary ammonium cation, the cation having attached to the ammonium nitrogen atom one or more substituents selected from the group consisting of unsubstituted alkyl and substituted alkyl wherein the alkyl in each case is a branched or a linear alkyl.

The use of a composition comprising a primary ammonium, secondary ammonium, tertiary ammonium, or quaternary ammonium cation as defined above (or as defined above as being preferred) is preferred as the substituents attached to the nitrogen atom tailor the properties of the resulting cation or of the resulting overall salt according to the individual needs. The person skilled in the art in view of the individual situation will select the appropriate ammonium cation so as to tune the surfactant properties of the corresponding salt.

More preferred is the use according to the present invention of a composition as defined above (or as defined above as being preferred), wherein the one or at least one of the more than one ammonium salt(s) comprises a quaternary ammonium cation having attached to the ammonium nitrogen atom one or more substituents selected from the group consisting of methyl, ethyl, 1-propyl, 2-propyl, 1-butyl, 2-butyl, 1-pentyl, 2-pentyl, 3-pentyl, 1-hexyl, 2-hexyl, 3-hexyl, 2-methylprop-1-yl, 2-methylprop-2-yl, 2-methylbut-1-yl, 3-methylbut-1-yl, 2-methylbut-2-yl, 3-methylbut-2-yl, 2-methylpent-1-yl, 2-methylpent-2-yl, 2-methylpent-3-yl, 3-methylpent-1-yl, 3-methylpent-2-yl, 3-methylpent-3-yl, 4-methylpent-1-yl and 4-methylpent-2-yl, wherein each of these substituents is unsubstituted or substituted with one or more groups comprising oxygen, sulphur, nitrogen, chlorine, or bromine atoms.

Such relatively short unsubstituted or substituted alkyl groups attached to the nitrogen of the ammonium ion as described above typically provide both a suitable solubility and good surfactant properties of the corresponding ammonium salt.

More preferred is the use according to the present invention of a composition as defined above (or as defined above as being preferred), wherein the one or at least one of the more than one ammonium salt(s) comprises a quaternary ammonium cation having attached to the ammonium nitrogen atom one or more substituents selected from the group consisting of hydroxy-substituted alkyl radicals, the alkyl radicals being selected from methyl, ethyl, prop-1-yl, prop-2-yl, but-1-yl, but-2-yl, pent-1-yl, pent-2-yl, pent-3-yl, hex-1-yl, hex-2-yl, hex-3-yl, 2-methylprop-1-yl, 2-methylprop-2-yl, 2-methylbut-1-yl, 3-methylbut-1-yl, 2-methylbut-2-yl, 3-methylbut-2-yl, 2-methylpent-1-yl, 2-methylpent-2-yl, 2-methylpent-3-yl, 3-methylpent-1-yl, 3-methylpent-2-yl, 3-methylpent-3-yl, 4-methylpent-1-yl and 4-methylpent-2-yl (i.e. each of the alkyl radicals stated bears a hydroxy group), wherein preferably the one or more substituents are selected from the group consisting of hydroxymethyl, 2-hydroxyeth-1-yl, 2-hydroxyprop-1-yl, 3-hydroxyprop-1-yl, 1-hydroxyprop-2-yl, 2-hydroxybut-1-yl, 3-hydroxybut-1-yl, 4-hydroxybut-1-yl, 1-(hydroxymethyl)prop-1-yl, 2-hydroxy-1-methylprop-1-yl, 3-hydroxy-1-methylprop-1-yl, 2-hydroxy-2-methylprop-1-yl and 2-hydroxy-1,1-dimethyleth-1-yl, wherein more preferably the one or more substituents are 2-hydroxyeth-1-yl.

The use according to the present invention of a composition as defined above (or as defined above as being preferred) is more preferred, wherein the one or at least one of the more than one ammonium salt(s) comprises a quaternary ammonium cation having attached to the ammonium nitrogen atom (a) one, two or three substituents selected from the group consisting of unsubstituted methyl, ethyl, prop-1-yl, prop-2-yl, but-1-yl, but-2-yl, pent-1-yl, pent-2-yl, pent-3-yl, hex-1-yl, hex-2-yl, hex-3-yl, 2-methylprop-1-yl, 2-methylprop-2-yl, 2-methylbut-1-yl, 3-methylbut-1-yl, 2-methylbut-2-yl, 3-methylbut-2-yl, 2-methylpent-1-yl, 2-methylpent-2-yl, 2-methylpent-3-yl, 3-methylpent-1-yl, 3-methylpent-2-yl, 3-methylpent-3-yl, 4-methylpent-1-yl and 4-methylpent-2-yl, and (b) one or more substituents selected from the group consisting of substituted methyl, ethyl, prop-1-yl, prop-2-yl, but-1-yl, but-2-yl, pent-1-yl, pent-2-yl, pent-3-yl, hex-1-yl, hex-2-yl, hex-3-yl, 2-methylprop-1-yl, 2-methylprop-2-yl, 2-methylbut-1-yl, 3-methylbut-1-yl, 2-methylbut-2-yl, 3-methylbut-2-yl, 2-methylpent-1-yl, 2-methylpent-2-yl, 2-methylpent-3-yl, 3-methylpent-1-yl, 3-methylpent-2-yl, 3-methylpent-3-yl, 4-methylpent-1-yl and 4-methylpent-2-yl, wherein each of these substituents attached to the ammonium nitrogen atom is substituted with one or more groups comprising oxygen, sulfur, nitrogen, chlorine, or bromine atoms, wherein each of these substituents attached to the ammonium nitrogen atom is preferably selected from the group consisting hydroxymethyl, 2-hydroxyeth-1-yl, 2-hydroxyprop-1-yl, 3-hydroxyprop-1-yl, 1-hydroxyprop-2-yl, 2-hydroxybut-1-yl, 3-hydroxybut-1-yl, 4-hydroxybut-1-yl, 1-(hydroxymethyl)prop-1-yl, 1-hydroxy-1-methylprop-1-yl, 2-hydroxy-1-methylprop-1-yl, 3-hydroxy-1-methylprop-1-yl, 2-hydroxy-2-methylprop-1-yl and 2-hydroxy-1,1-dimethyleth-1-yl, more preferably 2-hydroxyeth-1-yl, wherein the total number of substituents attached to the ammonium nitrogen atom is 2, 3, or 4.

The use according to the present invention of a composition as defined above (or as defined above as being preferred) is more preferred, wherein the one or at least one of the more than one ammonium salt(s) comprises a quaternary ammonium cation having attached to the ammonium nitrogen atom (a) three substituents selected from the group consisting of unsubstituted methyl, ethyl, prop-1-yl, prop-2-yl, but-1-yl, but-2-yl, pent-1-yl, pent-2-yl, pent-3-yl, hex-1-yl, hex-2-yl, hex-3-yl, 2-methylprop-1-yl, 2-methylprop-2-yl, 2-methylbut-1-yl, 3-methylbut-1-yl, 2-methylbut-2-yl, 3-methylbut-2-yl, 2-methylpent-1-yl, 2-methylpent-2-yl, 2-methylpent-3-yl, 3-methylpent-1-yl, 3-methylpent-2-yl, 3-methylpent-3-yl, 4-methylpent-1-yl and 4-methylpent-2-yl, wherein preferably all three substituents are methyl, and (b) one substituent selected from the group consisting of methyl, ethyl, prop-1-yl, prop-2-yl, but-1-yl, but-2-yl, pent-1-yl, pent-2-yl, pent-3-yl, hex-1-yl, hex-2-yl, hex-3-yl, 2-methylprop-1-yl, 2-methylprop-2-yl, 2-methylbut-1-yl, 3-methylbut-1-yl, 2-methylbut-2-yl, 3-methylbut-2-yl, 2-methylpent-1-yl, 2-methylpent-2-yl, 2-methylpent-3-yl, 3-methylpent-1-yl, 3-methylpent-2-yl, 3-methylpent-3-yl, 4-methylpent-1-yl and 4-methylpent-2-yl, wherein each of these substituents attached to the ammonium nitrogen atom is substituted with one or more groups comprising oxygen, sulfur, nitrogen, chlorine, or bromine atoms, wherein each of these substituents attached to the ammonium nitrogen atom is preferably selected from the group consisting of hydroxymethyl, 2-hydroxyeth-1-yl, 2-hydroxyprop-1-yl, 3-hydroxyprop-1-yl, 1-hydroxyprop-2-yl, 2-hydroxybut-1-yl, 3-hydroxybut-1-yl, 4-hydroxybut-1-yl, 1-(hydroxymethyl)prop-1-yl, 2-hydroxy-1-methylprop-1-yl, 3-hydroxy-1-methylprop-1-yl, 2-hydroxy-2-methylprop-1-yl, 2-hydroxy-1,1-dimethyleth-1-yl and 5-hydroxy-3-oxa-pentyl, wherein the substituent more preferably is 2-hydroxyeth-1-yl.

Short substituted alkyl groups attached to the nitrogen of the ammonium ion in combination with alkyl groups having an OH-group as described above have the optimum value in both solubility of the ammonium salt of the surfactant and its ability to act as an interfacial active compound. The OH-group attached to one of the substituents of the ammonium nitrogen atom additionally increases the ability of the formulation as described herein to dissolve and remove particles from (photoresist) surfaces.

More specifically, a composition is preferably used comprising one or more ammonium salt(s), wherein the one or at least one of the more than one ammonium salt(s) comprising at least one ammonium cation selected from the group consisting of
tris(2-hydroxyethyl)ammonium,
bis(2-hydroxyethyl)ammonium,
tris(2-hydroxyethyl)methylammonium,
bis(2-hydroxyethyl)dimethylammonium,
2-hydroxyethyltrimethylammonium (hereinbelow also referred to as "choline cation" or "choline"),
2-hydroxyethyltriethylammonium,
2-hydroxypropyltrimethylammonium,
bis(2-hydroxypropyl)dimethylammonium,
and
tris(2-hydroxypropyl)methylammonium.

Such ammonium salts (as preferably present in a composition used according to the present invention) show more improved solubility in aqueous solution. Under ambient conditions, handling is easier as no low boiling compounds are generated, which could smell.

The (most) preferred ammonium cations as defined above (or as defined above as being preferred) can be combined with other (most) preferred ammonium cations in order to prepare compositions which can be used for cleaning or rinsing a product comprising a substrate and supported thereon a patterned material layer having line-space structures with a line width of 50 nm or below according to the present invention.

It is particularly preferred to use only one kind of ammonium cation as defined hereinabove as being (most) preferred. In some cases however, it is preferred to use compositions comprising more than one kind of ammonium cations as defined hereinabove as being (most) preferred.

In some cases, the use according to the present invention of a composition as defined above (or as defined above as being preferred) is more preferred, wherein the one or at least one of the more than one ammonium salt(s) comprises an anion having two or three ester groups of general formula (1)

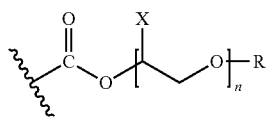

(1)

wherein in each ester group of general formula (1), independently of each other,
n is 0, 1 or 2, preferably n=0,
X is hydrogen, methyl or ethyl,
R is selected from the group consisting of
    unsubstituted branched alkyl,
    unsubstituted linear alkyl,
    substituted linear alkyl,
    substituted branched alkyl,
    unsubstituted branched alkenyl,
    unsubstituted linear alkenyl,
    substituted linear alkenyl,
and
    substituted branched alkenyl.

Ester groups according to general formula (1) due to the presence of group R are relatively hydrophobic (in comparison with the anionic sulfo-group), and the presence of group R thus is a reason why a corresponding anion of an ammonium salt as described herein is capable of acting as a surfactant.

If not stated otherwise in the present text, ester groups of general formula (1) with n=0 are preferred in comparison with ester groups of general formula (1) with n=1 or n=2. This holds true for all kinds of combinations of features designated in the present text as preferred.

According to the present invention, the ester groups of general formula (1) are esterified carboxylic acid groups of sulfobutanedioic acid, (sulfomethyl)-butanedioic acid, methyl-sulfobutanedioic acid, sulfoglutaric acid or sulfotricarballic acid of the compositions as defined above.

The use of a composition comprising one or more ammonium salt(s), wherein the one or at least one of the more than one ammonium salt(s) comprises an anion having two or three ester groups of general formula (1) is preferred because said ammonium salt(s) act as surfactants and thus do not only help to dissolve residues, e.g. dirt, particles or deposits, but also lower the equilibrium and also dynamic surface tension of the composition thus avoiding or reducing the risk of, for example, pattern collapse due to high capillary forces of liquids with high equilibrium surface tension. The use of alkyl or alkenyl moieties as group R in ester groups of general formula (1), as defined above, is preferable. Comparison experiments show that, e.g., unsubstituted aromatic groups used instead of alkyl or alkenyl moieties as R lead to surfactants showing a slightly higher equilibrium surface tension, which is not desired.

Moreover, and without wishing to be bound by any theory, it is believed that anions having two or three ester groups of general formula (1) preferably bind to the surface and modify the surface energy (wettability, or degree of hydrophobicity) of the patterned material, such that at the end of the rinsing phase the surface energy is lower than at the beginning. Thus, in a drying step water can efficiently be evaporated or spun off from the surface of a patterned material that has been treated with a composition as used according to the present invention.

The use according to the present invention of a composition as defined above (or as defined above as being preferred) is particularly preferred,
wherein in each ester group of general formula (1), independently of each other, R has a total number of carbon atoms in the range of from 1 to 18, preferably 5 to 13, more preferably 8 to 12, most preferably 9 to 10.

The corresponding ammonium salt(s) (surfactants) having such moieties usually show a good balance between solubility and interfacial activity.

The use according to the present invention of a composition as defined above (or as defined above as being preferred) is particularly preferred, wherein R is selected from the group consisting of
unsubstituted branched alkyl
and
unsubstituted branched alkenyl.

The corresponding ammonium salt(s) (surfactants) having such branched alkyl or alkenyl moieties usually show an even higher interfacial activity.

In many cases, the use according to the present invention of a composition as defined above (or as defined above as being preferred) is most preferred, wherein each ester group of general formula (1), independently of each other
(a) (i) R has a total number of carbon atoms in the main carbon chain of the unsubstituted branched alkyl or unsubstituted branched alkenyl in the range of from 5 to 8 carbon atoms, preferably 6 to 7 carbon atoms
and/or
(ii) R has a total number of carbon atoms in side chains of the unsubstituted branched alkyl or unsubstituted branched alkenyl in the range of from 1 to 4 carbon atoms, preferably from 2 to 3 carbon atoms
and/or
(b) n is 0 and R is the residue of an alcohol esterified with the corresponding carboxyl group, wherein said alcohol has a branching factor in the range of from 0.1 to 8, preferably from 1 to 5, more preferably from 1 to 3.

The corresponding ammonium salt(s) (surfactants) having such branched alkyl or alkenyl moieties usually show a preferably low dynamic interfacial tension.

In particular, a use according to the present invention of a composition as defined above (or as defined above as being preferred), is preferred, wherein R is independently of each other selected from the group consisting of
3,5,5-trimethylhexyl,
2-ethylhexyl,
3,3-dimethylbutyl,
2,4,4-trimethylpentyl,
2,2-dimethylpropyl,
2-propylheptyl,
isononyl,
isodecyl,
isotridecyl,
2,6-dimethyl-4-heptyl,
1-iso-butyl-3,5-dimethylhexyl,
5,7,7-trimethyl-2-(1,3,3-trimethylbutyl)octyl,
2-propylpentyl,
1-ethyl-2-methylpentyl
and
6-methyl-2-heptyl.

The corresponding ammonium salt(s) (surfactants) assemble themselves in very short time at interfaces and stay there for sufficient time, which is desired for fast processes and for the described applications.

The above described R groups are specifically preferred for ester groups of formula (1) with n=0.

A use according to the present invention of a composition as defined above (or as defined above as being preferred) is preferred, wherein each R in each ester group of general formula (1) is the same. Even more preferred is the use of a composition as defined above (or as defined above as being preferred), wherein each R in each ester group of general formula (1) is the same and n=0.

The corresponding ammonium salt(s) (surfactants) show an even higher tendency to assemble themselves at interfaces and to remain there for sufficient time. In addition, the interface is stabilized in an effective way.

If each R in each ester group of general formula (1) is the same the ammonium salt(s) can be synthesized in a convenient and time efficient manner.

Preferred is the use according to the present invention of a composition as defined above (or as defined above as being preferred), wherein the composition comprises
one or more ammonium salt(s) comprising a trimethyl-2-hydroxyethylammonium cation
and
one or more of the following anions:

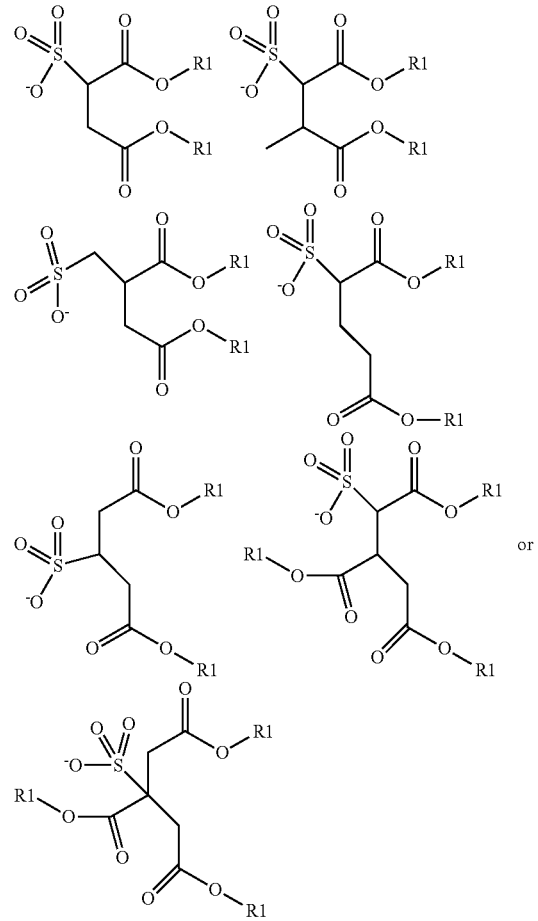

wherein R1 is selected from the group consisting of
3,5,5-trimethylhexyl,
2-ethylhexyl,
3,3-dimethyl-2-butyl,
and
2,4,4-trimethylpentyl.

As similarly stated above, the (most) preferred anions having an ester group of general formula (1) can be combined with one or more ammonium cations as defined above as being (most) preferred in order to prepare compositions as defined above that can be used for cleaning or rinsing a product comprising a substrate and supported thereon a patterned material layer having line-space structures with a line width of 50 nm or below.

For the purposes of the present invention, preferred ammonium salt(s) of compositions as defined above are ammonium salt(s) wherein the anion has the structure of sulfobutanedioic acid diester(s), (sulfomethyl)-butanedioic acid diester(s), methyl-sulfobutanedioic acid diester(s), sulfoglutaric acid diester(s) or sulfotricarballic acid triester(s) having R1 groups as defined above, wherein the cation has the structure of a (preferred or most preferred) quaternary ammonium cation as defined above. In more detail, further (non-limiting) examples of combinations of preferred cations with preferred anions for the use of compositions as defined above are listed below:

Use according to the present invention of a composition as defined above comprising a salt having 2-hydroxy-ethyl-trimethylammonium as a cation and a 3,5,5-trimethylhexyl sulfobutanedioic acid diester as anion.

Use according to the present invention of a composition as defined above comprising a salt having 2-hydroxy-ethyl-trimethylammonium as a cation and a 2-ethyl-hexyl sulfobutanedioic acid diester as anion.

Use according to the present invention of a composition as defined above comprising a salt having 2-hydroxy-ethyl-trimethylammonium as a cation and a 3,3-dim-ethyl-2-butyl sulfobutanedioic acid diester as anion.

Use according to the present invention of a composition as defined above comprising a salt having 2-hydroxy-ethyl-trimethylammonium as a cation and a 2,4,4-trimethylpentyl sulfobutanedioic acid diester as anion.

Use according to the present invention of a composition as defined above comprising a salt having 2-hydroxy-ethyl-trimethylammonium as a cation and a 3,5,5-trimethylhexyl (sulfomethyl)-butanedioic acid diester as anion.

Use according to the present invention of a composition as defined above comprising a salt having 2-hydroxy-ethyl-trimethylammonium as a cation and a 2-ethyl-hexyl (sulfomethyl)-butanedioic acid diester as anion.

Use according to the present invention of a composition as defined above comprising a salt having 2-hydroxy-ethyl-trimethylammonium as a cation and a 3,3-dim-ethyl-2-butyl (sulfomethyl)-butanedioic acid diester as anion.

Use according to the present invention of a composition as defined above comprising a salt having 2-hydroxy-ethyl-trimethylammonium as a cation and a 2,4,4-trimethylpentyl (sulfomethyl)-butanedioic acid diester as anion.

Use according to the present invention of a composition as defined above comprising a salt having 2-hydroxy-ethyl-trimethylammonium as a cation and a 3,5,5-trimethylhexyl methyl-sulfobutanedioic acid diester as anion.

Use according to the present invention of a composition as defined above comprising a salt having 2-hydroxy-ethyl-trimethylammonium as a cation and a 2-ethyl-hexyl methyl-sulfobutanedioic acid diester as anion.

Use according to the present invention of a composition as defined above comprising a salt having 2-hydroxy-ethyl-trimethylammonium as a cation and a 3,3-dim-ethyl-2-butyl methyl-sulfobutanedioic acid diester as anion.

Use according to the present invention of a composition as defined above comprising a salt having 2-hydroxy-ethyl-trimethylammonium as a cation and a 2,4,4-trimethylpentyl methyl-sulfobutanedioic acid diester as anion.

Use according to the present invention of a composition as defined above comprising a salt having 2-hydroxy-ethyl-trimethylammonium as a cation and a 3,5,5-trimethylhexyl sulfoglutaric acid diester as anion.

Use according to the present invention of a composition as defined above comprising a salt having 2-hydroxy-ethyl-trimethylammonium as a cation and a 2-ethyl-hexyl sulfoglutaric acid diester as anion.

Use according to the present invention of a composition as defined above comprising a salt having 2-hydroxy-ethyl-trimethylammonium as a cation and a 3,3-dim-ethyl-2-butyl sulfoglutaric acid diester as anion.

Use according to the present invention of a composition as defined above comprising a salt having 2-hydroxy-ethyl-trimethylammonium as a cation and a 2,4,4-trimethylpentyl sulfoglutaric acid diester as anion.

Use according to the present invention of a composition as defined above comprising a salt having 2-hydroxy-ethyl-trimethylammonium as a cation and a 3,5,5-trimethylhexyl sulfotricarballic acid triester as anion.

Use according to the present invention of a composition as defined above comprising a salt having 2-hydroxy-ethyl-trimethylammonium as a cation and a 2-ethyl-hexyl sulfotricarballic acid triester as anion.

Use according to the present invention of a composition as defined above comprising a salt having 2-hydroxy-ethyl-trimethylammonium as a cation and a 3,3-dim-ethyl-2-butyl sulfotricarballic acid triester as anion.

Use according to the present invention of a composition as defined above comprising a salt having 2-hydroxy-ethyl-trimethylammonium as a cation and a 2,4,4-trimethylpentyl sulfotricarballic acid triester as anion.

Preferred is the use according to the present invention of a composition as defined above (or as defined above as being preferred) wherein the composition is an aqueous composition. Aqueous compositions are preferably used for cleaning or rinsing because in many cases the combination of a surfactant and an aqueous solvent provides a high solubility and dispersing efficiency for ionic, non-ionic hydrophobic and non-ionic hydrophilic compounds or particles. In the aqueous composition the amount of water is preferably above 50 percent by weight, preferably above 80 percent by weight, more preferably above 90 percent by weight, based on the total amount of the composition.

Water is a preferred solvent as it is an environmentally friendly non VOC (non volatile organic compound) solvent. In many cases, water unlike organic solvents does not influence the pattern structure by swelling or dissolving it. However, depending on the photoresist type in some cases water causes swelling, too.

Preferred is the use according to the present invention of a composition as defined above (or as defined above as being preferred) wherein the total amount of ammonium cations of the one or more ammonium salt(s) is in the range of from $2 \times 10^{-5}$ to $4 \times 10^{-2}$ mol/L and/or the total amount of anions of the one or more ammonium salt(s) as defined above is in the range of from $2 \times 10^{-5}$ to $4 \times 10^{-2}$ mol/L.

The above-defined concentrations of the cations and anions typically provide an optimum combination of the following parameters/properties:

(i) (reduced) formation of large surfactant aggregates on the wafer surface, which could cause defects, (ii) (reduced) foam volume during application, and (iii) improved cleaning or rinsing properties of the resulting composition.

In many cases preferred is the use according to the present invention of a composition as defined above (or as defined above as being preferred) wherein the composition has an equilibrium surface tension of less than 35 mN/m, preferably of less than 30 mN/m, more preferably of less than 27 mN/m, most preferably of less than 25 mN/m, determined at the critical micelle concentration.

The lower the equilibrium surface tension of the composition the lower the capillary forces to prevent or reduce pattern collapse (according to Namatsu et al. Appl. Phys. Let. 66(20), 1995 as mentioned before). An additional advantage of the use according to the present invention of such compositions having a specific equilibrium surface tension is that penetration and cleaning of patterned material layer having line-space structures (pattern) in nm-scale is very efficient.

For the sake of comparison, according to Römpp-Lexikon Chemie, $10^{th}$ edition, 1999, volume 6, page 4434 seq., entry 'Tenside' (=surfactants), 'Tab. 5', typical equilibrium surface tensions are in the range of 25 to 40 mN/m for surfactants based on hydrocarbons, while perfluorinated surfactants usually provide equilibrium surface tensions from 15 to 25 mN/m. As one can see in table 1 of the present text, below, solutions comprising ammonium salt(s) as defined above have equilibrium surface tensions, which are very close to or even in the range of perfluorinated surfactants. For example, an aqueous solution comprising 2-hydroxyethyl-trimethylammonium di(3,5,5-trimethylhexyl) sulfobutanedioic acid diester has a equilibrium surface tension below 24 mN/m at the micelle concentration. As perfluorinated surfactants usually have a high risk of bioaccumulation and low degree of biodegradability, the use of perfluorinated surfactants (e.g. perfluorooctan sulfonic acid and its salts) is not desired due to their undesirable ecological profile, see: Environ Health Perspect. 2010 August; 118(8): 1100-1108.

The skilled person adjusts the equilibrium surface tension according to the usual routines.

Preferred is the use according to the present invention of a composition as defined above (or as defined above as being preferred), wherein said cleaning or rinsing is part of a process of making integrated circuit devices, optical devices, micromachines, or mechanical precision devices.

Preferred is the use according to the present invention of a composition as defined above (or as defined above as being preferred), wherein the composition is used for cleaning or rinsing a product comprising a substrate and supported thereon a patterned material layer having line-space structures with a line width of 50 nm or below, so that pattern collapse is prevented, line edge roughness is reduced, watermark defects are prevented or removed, photoresist-swelling is prevented or reduced, blob defects are prevented or reduced and/or particles are removed. The presence of the before mentioned flaws or effects would have a negative impact on the IC device performance, in particular for devices as integrated circuit devices, optical devices, micromachines, or mechanical precision devices, and correspondingly the present invention (which helps to avoid these flaws or effects) is of high industrial value.

In many cases, the use according to the present invention of a composition as defined above (or as defined above as being preferred) is preferred wherein the patterned material layer having line-space structures with a line width of 50 nm or below is selected from the group consisting of patterned developed photoresist layers, patterned barrier material layers, patterned multi-stack material layers, and patterned dielectric material layers.

Patterned developed photoresist layers, patterned barrier material layers, patterned multi-stack material layers, and patterned dielectric material layers are particularly prone to pattern collapse, low line edge roughness and photoresist-swelling. Avoiding these negative effects improves device performance as well as production output as the number of malfunctioning devices produced is considerably reduced.

Particularly, the use according to the present invention of a composition as defined above (or as defined above as being preferred) is preferred, wherein the patterned material layer has line-space structures with a line width of 32 nm or below, preferably 22 nm or below. Patterned material layers with line-space structures with a line width of 30 nm or below, preferably 22 nm or below, are particularly prone to pattern collapse during cleaning or rinsing, and thus are preferably cleaned and rinsed with compositions as defined above, preferably with compositions as defined above having an equilibrium surface tension of less than 35 mN/m, preferably of less than 30 mN/m, more preferably of less than 25 mN/m, determined at the critical micelle concentration. Advantages of the use according to the present invention of such compositions having a specific equilibrium surface tension are stated above.

Preferred is the use according to the present invention of a composition as defined above (or as defined above as being preferred), wherein the patterned material layer has aspect ratios of greater than 10 for non-photoresist structures and aspects ratios of greater than 2 for photoresist structures. Material layers having aspect ratios of greater than 10 for non-photoresist structures and aspects ratios of greater than 2 for photoresist structures are particularly prone to pattern collapse during cleaning or rinsing and thus are preferably cleaned and rinsed with compositions as defined above, preferably with compositions as defined above having an equilibrium surface tension of less than 35 mN/m, preferably of less than 30 mN/m, more preferably of less than 25 mN/m, determined at the critical micelle concentration. Advantage of such compositions is that pattern collapse is particularly reduced or avoided.

The aspect ratio of a patterned material layer can readily be determined by scanning electron microscopy with a Hitachi CG 4000.

The present invention also relates to a method of making a cleaned and rinsed product comprising a substrate and supported thereon a patterned material layer having line-space structures with a line width of 50 nm or below, the method comprising the following steps:

preparing or providing a product comprising a substrate and supported thereon a patterned material layer having line-space structures with a line width of 50 nm or below, preparing or providing a composition as defined above and/or as defined in the claims, and cleaning or rinsing said product with said composition so that the cleaned or rinsed product results.

Generally, all aspects of the present invention discussed herein above in the context of the inventive use of a composition comprising one or more ammonium salt(s) apply mutatis mutandis to the method of the present invention. And likewise all aspects of the inventive method of making a cleaned or a rinsed product discussed herein below apply mutatis mutandis to the use according to the present invention of a composition comprising one or more ammonium salt(s).

In the method of the present invention the step of providing said product comprising a substrate and supported thereon a patterned material layer having line-space structures with a line width of 50 nm or below preferably includes a photolithographic method. Regarding the photolithographic method in general and regarding specific embodiments of such a photolithographic method it is referred to the patent and non-patent literature discussed above. Specific examples of the method of the present invention are stated below.

Preferred is a method as described above (or as defined above as being preferred) comprising the following steps:
providing a substrate with an immersion photoresist, EUV photoresist or eBeam photoresist layer,
exposing the photoresist layer to actinic radiation through a mask with or without an immersion liquid,
developing the exposed photoresist layer with a developer solution to obtain a pattern having line-space structures with a line width of 50 nm or below, so that the product results comprising a substrate and supported thereon a patterned material layer having line-space structures with a line width of 50 nm or below,
cleaning or rinsing said product with said composition so that the cleaned or rinsed product results,
and optionally
drying said cleaned or rinsed product, preferably by spin drying or by a drying process making use of the Marangoni effect.

Particularly preferred is a method of making a cleaned or rinsed product as described above (or as defined above as being preferred), wherein the composition is as defined herein above in the context of the use according to the present invention and/or (preferably "and") the patterned material layer is as defined above in the context of the method according to the present invention.

Surprisingly, it has been found that favorable results are achieved when using a composition as defined herein above in the context of the use according to the present invention for the cleaning or rinsing of a product comprising a substrate and supported thereon a patterned material layer having line-space structures with a line width of 50 nm or below. When producing patterned material layers having line-space structures with a line width of 15 nm or below, in particular 32 nm or below, more particularly 22 nm or below, according to the demands of the industry negative effects, for example pattern collapse, low line edge roughness, water mark defects, photoresist swelling, blob defects, or remaining particles, need to be minimized or removed, respectively, in order to meet the specifications for state-of-the-art IC devices.

The present invention also relates to a formulation, preferably for the use of cleaning or rinsing a product comprising a substrate and supported thereon a patterned material layer having line-space structures with a line width of 50 nm and below, comprising
water
and
one or more ammonium salt(s) as defined above and optionally
one or more organic solvent compounds,
wherein the formulation has
a color of HAZEN number below 1000, preferably below 100, more preferably below 50,
and/or
a turbidity in the range of from 0.08 to 10 NTU, preferably in the range of from 0.2 to 5 NTU, more preferably in the range of from 0.2 to 1 NTU.

The NTU-value should be determined according to the EPA method 180.1, in particular with a HACH LANGE 2100 G instrument.

The HAZEN number (also known as APHA number) should be determined according to method DIN EN 150 6271-2, in particular with a Lange LICO 400 instrument.

The formulation according to the present invention is a preferred composition for use according to the present invention and for use in the method of the present invention. The formulation according to the present invention is a solution or a suspension. If particles are present in the formulation, their concentration should be so low that HAZEN number and NTU-value are as stated above. Preferred formulations as defined below are particularly preferable for use according to the present invention and for use in the method of the present invention.

In many cases, and for many purposes in the context of the use according to the present invention and the method of the present invention, a formulation as defined above (or as defined above as being preferred) is preferred, wherein the total concentration of said ammonium salt(s) as defined above in particular in the context of the use according to the present invention is in the range of from $2\times10^{-6}$ to $4\times10^{-2}$ mol/L. The above-mentioned concentrations of the cations and anions typically provide an optimum combination of the following parameters/properties:
(i) (reduced) formation of large surfactant aggregates on the wafer surface, which could cause defects,
(ii) (reduced) foam volume during application,
and
(iii) improved cleaning or rinsing properties of the resulting composition.

More preferred is a formulation according to the present invention as described above (or as described above as being preferred), wherein
the one or more ammonium salt(s) of one or more compounds are ammonium salt(s) of one or more compounds selected from the group consisting of
(sulfomethyl)-butanedioic acid diester(s),
methyl-sulfobutanedioic acid diester(s),
sulfoglutaric acid diester(s),
and
sulfotricarballic acid triester(s).

More preferred is a formulation according to the present invention as described above (or as described above as being preferred), wherein
the one or at least one of the more than one ammonium salt(s) comprises at least one
ammonium cation selected from the group consisting of
tris(2-hydroxyethyl)ammonium,
bis(2-hydroxyethyl)ammonium,
tris(2-hydroxyethyl)methylammonium,
bis(2-hydroxyethyl)dimethylammonium,
2-hydroxyethyl-trimethylammonium,
2-hydroxyethyl-triethylammonium,
2-hydroxypropyl-trimethylammonium,
bis(2-hydroxypropyl)dimethylammonium,
and
tris(2-hydroxypropyl)methylammonium.

More preferred is a formulation according to the present invention as described above (or as described above as being preferred), wherein
the one or at least one of the more than one ammonium salt(s) comprises at least one
ammonium cation selected from the group consisting of
tris(2-hydroxyethyl)ammonium,
bis(2-hydroxyethyl)ammonium,
tris(2-hydroxyethyl)methylammonium,
bis(2-hydroxyethyl)dimethylammonium,
2-hydroxyethyl-trimethylammonium, 2-hydroxyethyl-triethylammonium,
2-hydroxypropyl-trimethylammonium,
bis(2-hydroxypropyl)dimethylammonium,
and
tris(2-hydroxypropyl)methylammonium.
and wherein the one or more ammonium salt(s) of one or more compounds are ammonium salt(s) of one or more compounds selected from the group consisting of
(sulfomethyl)-butanedioic acid diester(s),
methyl-sulfobutanedioic acid diester(s),
sulfoglutaric acid diester(s),
and
sulfotricarballic acid triester(s).

Even more preferred is a formulation according to the present invention as described above (or as described above as being preferred) comprising an organic solvent compound selected from the group consisting of
alcohols having a total number of 1 to 8 carbon atoms (more preferred 3 to 6 carbon atoms),
alkyl ethylene glycol,
alkyldiethylene glycol,
alkyltriethylene glycol,
alkylpropylene glycol,
alkyl dipropylene glycol
and
alkyl tripropylene glycol
wherein the alkyl in each case has a total number of carbon atoms in the range of from 1 to 7.

The advantage is that these solvents improve the solubility of ammonium salt(s) as defined above (i.e. as present in a composition used according to the present invention) in water. In addition, the formulation preferably is a liquid concentrate with high content of active material (ammonium salt(s) and, optionally, further active materials, particularly surfactant materials) using the ammonium salt(s) defined above and the solvents mentioned above and less than 5 wt.-% of water, based on the total amount of the formulation (i.e. concentrate). Surfactant content in such concentrates is above 30 wt.-%, more preferred above 40 wt.-%, most preferred 50 wt.-% or higher (the rest is the solvent as described above and less than 5 wt.-% water—optionally the formulation (concentrate) additionally contains one or more salts used in the synthesis procedure). Preferably, the viscosity of such concentrates at 20° C. and 10 Hz is less than 1000 mPas and more preferred less than 500 mPas (viscosities can be measured with an Anton Paar Rheolab QC instrument). Such liquid concentrates can easily be transported, handled and diluted with water (electronic grade) before use according to the present invention. In contrast, surfactant concentrates in water without the presence of such solvents in some cases form highly viscous gels at 20° C., if, e.g., the surfactant concentration is above 40 wt.-%. One would need to heat such highly viscous concentrates in order to lower their viscosity and to allow for a convenient handling.

Particularly preferred is a formulation according to the present invention as described above (or as described above as preferred) comprising less than 5 ppm metal cations, preferably less than 1 ppm, more preferably less than 0.05 ppm, even preferably less than 5 ppb, most preferably less than 3 ppb, based on the total weight of the formulation. An advantage of such a preferred formulation of the present invention is that undesired metals and metal ions are not incorporated in the integrated circuits, so that corresponding defects cannot result.

Preferred is also a formulation according to the present invention as described above (or as described above as being preferred), which contains only (single) particles of a maximum size <3 μm (i.e., no particles of a maximum size of 3 μm or more are present). More preferred is also a formulation according to the present invention as described above (or as described above as being preferred), which contains only (single) particles of a maximum size <300 nm (i.e., no particles of a maximum size of 300 nm or more are present).

Even more preferred is also a formulation according to the present invention as described above (or as described above as being preferred), which contains only (single) particles of a maximum size <30 nm (i.e., no particles of a maximum size of 30 nm or more are present). This can be e.g. achieved by filtration of the diluted formulation through a filter with pore sizes of less than 30 nm in diameter (optionally this process is repeated several times).

The formulation according to the present invention as described herein above preferably contains at least one co-surfactant selected from the group consisting of alkyl betaines, alkyl amido propyl betaines, ampho acetates, amine oxides and alkyl polyglucosides, wherein the alkyl group is having a total number of 6 to 16 carbon atoms, preferably a total number of 8 to 12 carbon atoms.

Surfactant solutions, preferably as a formulation as described above (or as described above as being preferred), has the advantage of having (particularly) improved cleaning and rinsing effects as described above.

The formulation according to the present invention as described herein above (or as described above as being preferred) more preferably contains at least one co-surfactant selected from the group consisting of
coco betaine,
coco amido propyl betain,
coco ampho acetate
coco ampho diacetate
lauryl dimethyl amine oxide
myristyl dimethylamine oxide
lauramine oxide
and
cocoamidopropylamino oxide.

Advantages of formulations according to the present invention containing one or more of the co-surfactants as mentioned above are, for example,
(i) a higher solubility of the ammonium salt(s) of compositions used according to the present invention
and/or
(ii) an improvement of the cleaning and rinsing effects as described above.

The present invention also relates to a method of making a formulation as described above (or as described above as being preferred), preferably for the use of cleaning or rinsing a product comprising a substrate and supported thereon a patterned material layer having line-space structures with a line width of 50 nm and below, comprising at least the following steps:
a) synthesizing one or more ammonium salts as described above (or as described above as being preferred) by a procedure comprising the addition of hydrogen sulfite anions to double-bonds of one or more α,β-unsaturated esters so that one or more corresponding diester or triester anions selected from the group consisting of
sulfobutanedioic acid diester anion,
(sulfomethyl)-butanedioic acid diester anion,
methyl-sulfobutanedioic acid diester anion,
sulfoglutaric acid diester anion,
and
sulfotricarballic acid triester anion
result,
b) mixing said one or more ammonium salts as synthesized in step a) with water and/or one or more organic solvents as described above in order to obtain a formulation, c) optionally filtering the formulation obtained in step b) through a filter with pore size of <30 nm in diameter.

Generally, all aspects of the present invention discussed herein above in the context of
the inventive use of a composition comprising one or more ammonium salt(s),
the method according to the invention of making a cleaned or rinsed product,
and/or
the formulation according to the invention
apply mutatis mutandis for the method of making a formulation according to the present invention. And likewise, all aspects of the inventive method of making a formulation discussed herein below apply mutatis mutandis for
the inventive use of a composition comprising one or more ammonium salt(s),
the method according to the invention of making a cleaned or rinsed product,
and/or
the formulation according to the invention.

In many cases, a method as defined above is preferred, wherein in step a)
the counter-cations of the hydrogen sulfite anions are ammonium cations as described above (or as described above as being preferred), so that after said addition of hydrogen sulfite anions to said double-bonds of one or more α,β-unsaturated esters the one or more ammonium salts as described above (or as described above as being preferred) are constituted
or
the counter-cations of the hydrogen sulfite anions are not ammonium cations selected from the group consisting of tris(2-hydroxyethyl)ammonium, bis(2-hydroxyethyl)ammonium, tris(2-hydroxyethyl)methylammonium, bis(2-hydroxyethyl)dimethylammonium, 2-hydroxyethyl-trimethylammonium, 2-hydroxyethyl-triethylammonium, 2-hydroxypropyl-trimethylammonium, bis(2-hydroxypropyl) dimethylammonium, and tris(2-hydroxypropyl) methylammonium, and the counter-cations are exchanged against one or more of these ammonium cations in a subsequent step, so that the one or more ammonium salts as defined above (or as described above as being preferred) are constituted
or
the counter-cations of the hydrogen sulfite anions are not ammonium cations, and the counter-cations are exchanged against ammonium cations in a subsequent step, so that the one or more ammonium salts as described above (or as described above as being preferred) are constituted.

Methods of making a formulation as described above (or as described above as being preferred) are advantageous since the target products are synthesized in only a few synthesis steps thus decreasing the reactor and/or plant equipment needed for the synthesis.

Preferred is a method of making a formulation as defined above as being preferred comprising step a),
wherein in a subsequent step
the counter-cations are exchanged against ammonium cations as defined for uses as described above as being preferred,
so that the one or more ammonium salts as defined for uses as described above as being preferred are constituted.

A method of making a formulation as described above (or as described above as being preferred) is preferred, wherein the resulting one or more corresponding diester or triester anions are selected from the group consisting of
(sulfomethyl)-butanedioic acid diester anion,
methyl-sulfobutanedioic acid diester anion,
sulfoglutaric acid diester anion,
and
sulfotricarballic acid triester anion.

A method of making a formulation as described above (or as described above as being preferred) is preferred, comprising the step of
c) filtering the formulation obtained in step b) through a filter with pore size of <30 nm in diameter,
and comprising as a further step
d) mixing the filtered formulation with additional water to give a diluted aqueous formulation.

By filtering with a filter with pore size of <30 nm in diameter bigger particles are removed which would otherwise remain on the surface of a product (the exposed and developed photoresist) after cleaning or rinsing said product with a composition as described above (or as described above as being preferred).

In particular a method of making a formulation as described (or as defined above as being preferred) is preferred wherein the water added is electronic grade water.

The step of adding electronic grade water to a formulation as described above (or as described above as being preferred) is advantageous since electronic grade water particularly prevents
watermark defects,
blob defects
and/or
reduces the amount of particles which remain on the surface of a product (the exposed and developed photoresist) after cleaning or rinsing said product with a composition as described above (or as described above as being preferred).

Specific aspects of the invention are summarized as follows:

1. Use of a composition comprising one or more ammonium salt(s) of one or more compounds selected from the group consisting of
sulfobutanedioic acid diester(s),
(sulfomethyl)-butanedioic acid diester(s),
methyl-sulfobutanedioic acid diester(s),
sulfoglutaric acid diester(s),
and
sulfotricarballic acid triester(s),
for cleaning or rinsing a product comprising a substrate and supported thereon a patterned material layer having line-space structures with a line width of 50 nm and below.

2. Use according to aspect 1, wherein the one or at least one of the more than one ammonium salt(s) comprises an ammonium cation selected from the group consisting of protonated ammonia ($NH_4^+$), primary ammonium, secondary ammonium, tertiary ammonium, and quaternary ammonium.

3. Use according to any preceding aspect, wherein the one or at least one of the more than one ammonium salt(s) comprises a primary ammonium, secondary ammonium, tertiary ammonium, or quaternary ammonium cation, the cation having attached to the ammonium nitrogen atom one or more substituents selected from the group consisting of unsubstituted alkyl and substituted alkyl, wherein the alkyl in each case is a branched or linear alkyl.

4. Use according to any preceding aspect, wherein the one or at least one of the more than one ammonium salt(s) comprises a quaternary ammonium cation having attached to the ammonium nitrogen atom one or more substituents selected from the group consisting of methyl, ethyl, 1-propyl, 2-propyl, 1-butyl, 2-butyl, 1-pentyl, 2-pentyl, 3-pentyl, 1-hexyl, 2-hexyl, 3-hexyl, 2-methylprop-1-yl, 2-methylprop-2-yl, 2-methylbut-1-yl, 3-methylbut-1-yl, 2-methylbut-2-yl, 3-methylbut-2-yl, 2-methylpent-1-yl, 2-methylpent-2-yl, 2-methylpent-3-yl, 3-methylpent-1-yl, 3-methylpent-2-yl, 3-methylpent-3-yl, 4-methylpent-1-yl and 4-methylpent-2-yl, wherein each of these substituents is unsubstituted or substituted with one or more groups comprising oxygen, sulphur, nitrogen, chlorine, or bromine atoms.

5. Use according to aspect 4, wherein the one or at least one of the more than one ammonium salt(s) comprises a quaternary ammonium cation having attached to the ammonium nitrogen atom one or more substituents selected from the group consisting of hydroxy-substituted alkyl radicals, the alkyl radicals being selected from methyl, ethyl, prop-1-yl, prop-2-yl, but-1-yl, but-2-yl, pent-1-yl, pent-2-yl, pent-3-yl, hex-1-yl, hex-2-yl, hex-3-yl, 2-methylprop-1-yl, 2-methylprop-2-yl, 2-methylbut-1-yl, 3-methylbut-1-yl, 2-methylbut-2-yl, 3-methylbut-2-yl, 2-methylpent-1-yl, 2-methylpent-2-yl, 2-methylpent-3-yl, 3-methylpent-1-yl, 3-methylpent-2-yl, 3-methylpent-3-yl, 4-methylpent-1-yl and 4-methylpent-2-yl, wherein preferably the one or more substituents are selected from the group consisting of hydroxymethyl, 2-hydroxyeth-1-yl, 2-hydroxyprop-1-yl, 3-hydroxyprop-1-yl, 1-hydroxyprop-2-yl, 2-hydroxybut-1-yl, 3-hydroxybut-1-yl, 4-hydroxybut-1-yl, 1-(hydroxymethyl)prop-1-yl, 2-hydroxy-1-methylprop-1-yl, 3-hydroxy-1-methylprop-1-yl, 2-hydroxy-2-methylprop-1-yl and 2-hydroxy-1,1-dimethyleth-1-yl, wherein more preferably the one or more substituents are 2-hydroxyeth-1-yl.

6. Use according to any of aspects 2 to 5, wherein the one or at least one of the more than one ammonium salt(s) comprises a quaternary ammonium cation having attached to the ammonium nitrogen atom
    (a) one, two or three substituents selected from the group consisting of unsubstituted methyl, ethyl, prop-1-yl, prop-2-yl, but-1-yl, but-2-yl, pent-1-yl, pent-2-yl, pent-3-yl, hex-1-yl, hex-2-yl, hex-3-yl, 2-methylprop-1-yl, 2-methylprop-2-yl, 2-methylbut-1-yl, 3-methylbut-1-yl, 2-methylbut-2-yl, 3-methylbut-2-yl, 2-methylpent-1-yl, 2-methylpent-2-yl, 2-methylpent-3-yl, 3-methylpent-1-yl, 3-methylpent-2-yl, 3-methylpent-3-yl, 4-methylpent-1-yl and 4-methylpent-2-yl,
    and
    (b) one or more substituents selected from the group consisting of substituted methyl, ethyl, prop-1-yl, prop-2-yl, but-1-yl, but-2-yl, pent-1-yl, pent-2-yl, pent-3-yl, hex-1-yl, hex-2-yl, hex-3-yl, 2-methylprop-1-yl, 2-methylprop-2-yl, 2-methylbut-1-yl, 3-methylbut-1-yl, 2-methylbut-2-yl, 3-methylbut-2-yl, 2-methylpent-1-yl, 2-methylpent-2-yl, 2-methylpent-3-yl, 3-methylpent-1-yl, 3-methylpent-2-yl, 3-methylpent-3-yl, 4-methylpent-1-yl and 4-methylpent-2-yl,
    wherein each of these substituents attached to the ammonium nitrogen atom is substituted with one or more groups comprising oxygen, sulfur, nitrogen, chlorine, or bromine atoms,
    wherein each of these substituents attached to the ammonium nitrogen atom is preferably selected from the group consisting hydroxymethyl, 2-hydroxyeth-1-yl, 2-hydroxyprop-1-yl, 3-hydroxyprop-1-yl, 1-hydroxyprop-2-yl, 2-hydroxybut-1-yl, 3-hydroxybut-1-yl, 4-hydroxybut-1-yl, 1-(hydroxymethyl)prop-1-yl, 1-hydroxy-1-methylprop-1-yl, 2-hydroxy-1-methylprop-1-yl, 3-hydroxy-1-methylprop-1-yl, 2-hydroxy-2-methylprop-1-yl and 2-hydroxy-1,1-dimethyleth-1-yl, more preferably 2-hydroxyeth-1-yl,
    wherein the total number of substituents attached to the ammonium nitrogen atom is 2, 3, or 4.

7. Use according to any of aspects 3 to 6, wherein the one or at least one of the more than one ammonium salt(s) comprises a quaternary ammonium cation having attached to the ammonium nitrogen atom
    (a) three substituents selected from the group consisting of unsubstituted methyl, ethyl, prop-1-yl, prop-2-yl, but-1-yl, but-2-yl, pent-1-yl, pent-2-yl, pent-3-yl, hex-1-yl, hex-2-yl, hex-3-yl, 2-methylprop-1-yl, 2-methylprop-2-yl, 2-methylbut-1-yl, 3-methylbut-1-yl, 2-methylbut-2-yl, 3-methylbut-2-yl, 2-methylpent-1-yl, 2-methylpent-2-yl, 2-methylpent-3-yl, 3-methylpent-1-yl, 3-methylpent-2-yl, 3-methylpent-3-yl, 4-methylpent-1-yl and 4-methylpent-2-yl, wherein preferably all three substituents are methyl,
    and
    (b) one substituent selected from the group consisting of methyl, ethyl, prop-1-yl, prop-2-yl, but-1-yl, but-2-yl, pent-1-yl, pent-2-yl, pent-3-yl, hex-1-yl, hex-2-yl, hex-3-yl, 2-methylprop-1-yl, 2-methylprop-2-yl, 2-methylbut-1-yl, 3-methylbut-1-yl, 2-methylbut-2-yl, 3-methylbut-2-yl, 2-methylpent-1-yl, 2-methylpent-2-yl, 2-methylpent-3-yl, 3-methylpent-1-yl, 3-methylpent-2-yl, 3-methylpent-3-yl, 4-methylpent-1-yl and 4-methylpent-2-yl,
    wherein each of these substituents attached to the ammonium nitrogen atom is substituted with one or more groups comprising oxygen, sulfur, nitrogen, chlorine, or bromine atoms,
    wherein each of these substituents attached to the ammonium nitrogen atom is preferably selected from the group consisting of hydroxymethyl, 2-hydroxyeth-1-yl, 2-hydroxyprop-1-yl, 3-hydroxyprop-1-yl, 1-hydroxyprop-2-yl, 2-hydroxybut-1-yl, 3-hydroxybut-1-yl, 4-hydroxybut-1-yl, 1-(hydroxymethyl)prop-1-yl, 2-hydroxy-1-methylprop-1-yl, 3-hydroxy-1-methylprop-1-yl, 2-hydroxy-2-methylprop-1-yl, 2-hydroxy-1,1-dimethyleth-1-yl and 5-hydroxy-3-oxa-pentyl, wherein the substituent more preferably is 2-hydroxyeth-1-yl.

8. Use according to any of aspects 3 to 7, wherein the one or at least one of the more than one ammonium salt(s) comprises at least one ammonium cation selected from the group consisting of
    tris(2-hydroxyethyl)ammonium,
    bis(2-hydroxyethyl)ammonium,
    tris(2-hydroxyethyl)methylammonium,
    bis(2-hydroxyethyl)dimethylammonium,
    2-hydroxyethyl-trimethylammonium,
    2-hydroxyethyl-triethylammonium,
    2-hydroxypropyl-trimethylammonium,
    bis(2-hydroxypropyl)dimethylammonium,
    and
    tris(2-hydroxypropyl)methylammonium.

9. Use according to any preceding aspect, wherein the one or at least one of the more than one ammonium salt(s) comprises an anion having two or three ester groups of general formula (1)

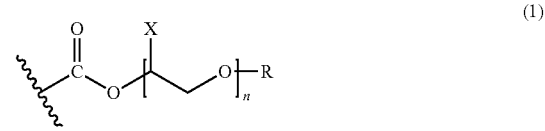

(1)

wherein in each ester group of general formula (1), independently of each other,
n is 0, 1 or 2,
X is hydrogen, methyl or ethyl,
R is selected from the group consisting of
    unsubstituted branched alkyl,
    unsubstituted linear alkyl,
    substituted linear alkyl,
    substituted branched alkyl,
    unsubstituted branched alkenyl,
    unsubstituted linear alkenyl,
    substituted linear alkenyl,
and
    substituted branched alkenyl.

10. Use according to aspect 9, wherein in each ester group of general formula (1), independently of each other,
R has a total number of carbon atoms in the range of from 1 to 18, preferably 5 to 13, more preferably 8 to 12, most preferably 9 to 10.

11. Use according to any of aspects 9 to 10, wherein R is selected from the group consisting of
unsubstituted branched alkyl
and
unsubstituted branched alkenyl.

12. Use according to aspect 11, wherein in each ester group of general formula (1), independently of each other,
(a) (i) R has a total number of carbon atoms in the main carbon chain of the unsubstituted branched alkyl or unsubstituted branched alkenyl in the range of from 5 to 8 carbon atoms, preferably 6 to 7 carbon atoms
and/or
(ii) R has a total number of carbon atoms in side chains of the unsubstituted branched alkyl or unsubstituted branched alkenyl in the range of from 1 to 4 carbon atoms, preferably from 2 to 3 carbon atoms
and/or
(b) n is 0 and R is the residue of an alcohol esterified with the corresponding carboxyl group, wherein said alcohol has a branching factor in the range of from 0.1 to 8, preferably from 1 to 5, more preferably from 1 to 3.

13. Use according to any of aspects 9 to 12, wherein R is independently of each other selected from the group consisting of
3,5,5-trimethylhexyl,
2-ethylhexyl,
3,3-dimethylbutyl,
2,4,4-trimethylpentyl,
2,2-dimethylpropyl,
2-propylheptyl,
isononyl,
isodecyl,
isotridecyl,
2,6-dimethyl-4-heptyl,
1-iso-butyl-3,5-dimethylhexyl,
5,7,7-trimethyl-2-(1,3,3-trimethylbutyl)octyl,
2-propylpentyl,
1-ethyl-2-methylpentyl
and
6-methyl-2-heptyl.

14. Use according to any of aspects 9 to 13, wherein each R in each ester group of general formula (1) is the same.

15. Use according to any preceding aspect wherein the composition comprises
    one or more ammonium salt(s) comprising a trimethyl-2-hydroxyethylammonium cation
    and
    one or more of the following anions:

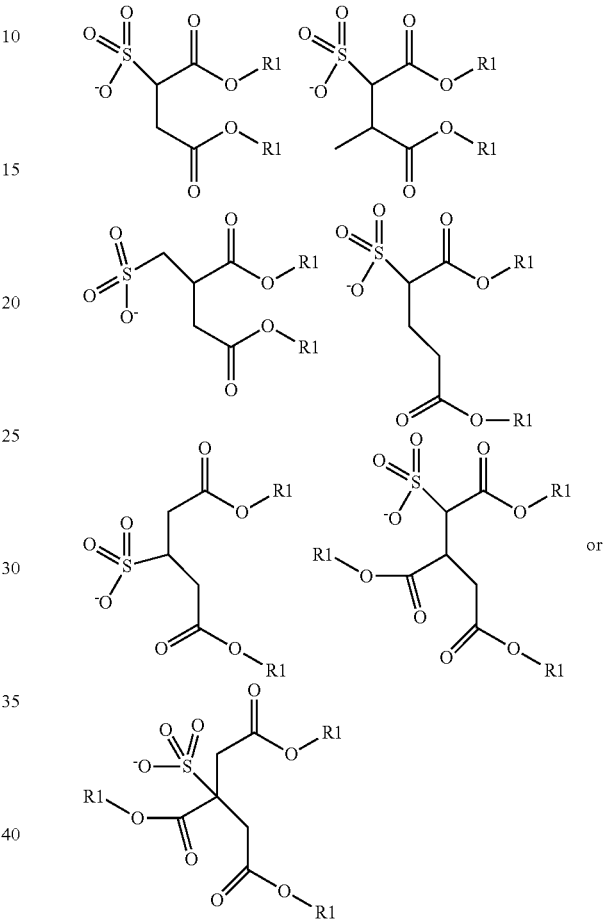

wherein R1 is selected from the group consisting of
    3,5,5-trimethylhexyl,
    2-ethylhexyl,
    3,3-dimethyl-2-butyl,
    and
    2,4,4-trimethylpentyl.

16. Use according to any preceding aspect, wherein the composition is an aqueous composition.

17. Use according to any preceding aspect, wherein
    the total amount of ammonium cations of the one or more ammonium salt(s) is in the range of from $2 \times 10^{-5}$ to $4 \times 10^{-2}$ mol/L
    and/or
    the total amount of anions of the one or more ammonium salt(s) as defined in any of aspects 9 to 16 is in the range of from $2 \times 10^{-5}$ to $4 \times 10^{-2}$ mol/L.

18. Use according to any preceding aspect, wherein the composition has an equilibrium surface tension of less than 35 mN/m, preferably of less than 30 mN/m, more preferably of less than 27 mN/m, most preferably of less than 25 mN/m, determined at the critical micelle concentration.

19. Use according to any preceding aspect, wherein said cleaning or rinsing is part of a process of making integrated circuit devices, optical devices, micromachines, or mechanical precision devices.

20. Use according to any preceding aspect, wherein the composition comprising one or more ammonium salt(s) is used for cleaning or rinsing so that pattern collapse is prevented,
line edge roughness is reduced,
watermark defects are prevented or removed,
photoresist-swelling is prevented or reduced,
blob defects are prevented or reduced,
and/or
particles are removed.

21. Use according to any preceding aspect, wherein the patterned material layer having line-space structures with a line width of 50 nm or below is selected from the group consisting of patterned developed photoresist layers, patterned barrier material layers, patterned multi-stack material layers, and patterned dielectric material layers.

22. Use according to any preceding aspect, wherein the patterned material layer has line-space structures with a line width of 32 nm or below, preferably 22 nm or below.

23. Use according to any preceding aspect, wherein the patterned material layer has aspect ratios of greater than 10 for non-photoresist structures and aspect ratios of greater than 2 for photoresist structures.

24. Method of making a cleaned or rinsed product comprising a substrate and supported thereon a patterned material layer having line-space structures with a line width of 50 nm or below, the method comprising the following steps:
preparing or providing a product comprising a substrate and supported thereon a patterned material layer having line-space structures with a line width of 50 nm or below,
preparing or providing a composition as defined in any of aspects 1 to 18,
and
cleaning or rinsing said product with said composition so that the cleaned or rinsed product results.

25. Method according to aspect 24 comprising the following steps:
providing a substrate with an immersion photoresist, EUV photoresist or eBeam photoresist layer,
exposing the photoresist layer to actinic radiation through a mask with or without an immersion liquid,
developing the exposed photoresist layer with a developer solution to obtain a pattern having line-space structures with a line width of 50 nm or below, so that the product results comprising a substrate and supported thereon a patterned material layer having line-space structures with a line width of 50 nm or below,
cleaning or rinsing said product with said composition so that the cleaned or rinsed product results,
and optionally
drying said cleaned or rinsed product, preferably by spin drying or by a drying process making use of the Marangoni effect.

26. Method according to any of aspect 24 to 25, wherein the composition is defined as in any of aspects 1 to 19 and/or the patterned material layer is defined as in any of aspects 22 to 24.

27. Formulation comprising
water
and
one or more ammonium salt(s) as defined in any of aspects 1 to 15
and optionally
one or more organic solvent compounds,
wherein the formulation has
a color of HAZEN number below 1000, preferably below 100, more preferably below 50,
and/or
a turbidity in the range of from 0.08 to 10 NTU, preferably in the range of from 0.2 to 5 NTU, more preferably in the range of from 0.2 to 1 NTU.

28. Formulation according to aspect 27, wherein the total concentration of said ammonium salt(s) as defined in any of aspects 1 to 16 is in the range of from $2\times10^{-5}$ to $4\times10^{-2}$ mol/L.

29. Formulation according to any of aspects 27 to 28, wherein
the one or more ammonium salt(s) of one or more compounds are ammonium salt(s) of one or more compounds selected from the group consisting of
(sulfomethyl)-butanedioic acid diester(s),
methyl-sulfobutanedioic acid diester(s),
sulfoglutaric acid diester(s),
and
sulfotricarballic acid triester(s).

30. Formulation according to any of aspects 27 to 29, wherein
the one or at least one of the more than one ammonium salt(s) comprises at least one ammonium cation selected from the group consisting of
tris(2-hydroxyethyl)ammonium,
bis(2-hydroxyethyl)ammonium,
tris(2-hydroxyethyl)methylammonium,
bis(2-hydroxyethyl)dimethylammonium,
2-hydroxyethyl-trimethylammonium,
2-hydroxyethyl-triethylammonium,
2-hydroxypropyl-trimethylammonium,
bis(2-hydroxypropyl)dimethylammonium,
and
tris(2-hydroxypropyl)methylammonium.

31. Formulation according to any of aspects 27 to 30, wherein
the one or at least one of the more than one ammonium salt(s) comprises at least one ammonium cation selected from the group consisting of
tris(2-hydroxyethyl)ammonium,
bis(2-hydroxyethyl)ammonium,
tris(2-hydroxyethyl)methylammonium,
bis(2-hydroxyethyl)dimethylammonium,
2-hydroxyethyl-trimethylammonium,
2-hydroxyethyl-triethylammonium,
2-hydroxypropyl-trimethylammonium,
bis(2-hydroxypropyl)dimethylammonium,
and
tris(2-hydroxypropyl)methylammonium.
and wherein the one or more ammonium salt(s) of one or more compounds are ammonium salt(s) of one or more compounds selected from the group consisting of
(sulfomethyl)-butanedioic acid diester(s),
methyl-sulfobutanedioic acid diester(s),
sulfoglutaric acid diester(s),
and
sulfotricarballic acid triester(s).

32. Formulation according to any of aspects 27 to 31 for the use of cleaning or rinsing a product comprising a substrate and supported thereon a patterned material layer having line-space structures with a line width of 50 nm and below.

33. Formulation according to any of aspects 27 to 32 comprising an organic solvent compound selected from the group consisting of
alcohols having a total number of 1 to 8 carbon atoms,
alkyl ethylene glycol,
alkyldiethylene glycol,
alkyltriethylene glycol,
alkylpropylene glycol,
alkyl dipropylene glycol
and
alkyl tripropylene glycol
wherein alkyl in each case has a total number of carbon atoms in the range of from 1 to 7.

34. Formulation according to any of aspects 27 to 33 comprising less than 5 ppm metal cations, preferably less than 1 ppm, more preferably less than 0.05 ppm, even more preferably less than 5 ppb, most preferably less than 3 ppb, based on the total weight of the formulation.

35. Formulation according to any of aspects 27 to 34, which contains only particles of a maximum size <3 µm, more preferably <300 nm, most preferably <30 nm.

36. Method of making a formulation according to any of aspects 27 to 35, comprising at least the following steps:
a) synthesizing one or more ammonium salts as defined in any of aspects 1 to 16 by a procedure comprising the addition of hydrogen sulfite anions to double-bonds of one or more α,β-unsaturated esters so that one or more corresponding diester or triester anions selected from the group consisting of
sulfobutanedioic acid diester anion,
(sulfomethyl)-butanedioic acid diester anion,
methyl-sulfobutanedioic acid diester anion,
sulfoglutaric acid diester anion,
and
sulfotricarballic acid triester anion
result,
b) mixing said one or more ammonium salts as synthesized in step a) with water and/or one or more organic solvents as defined in aspect 33 in order to obtain a formulation,
c) optionally filtering the formulation obtained in step b) through a filter with pore size of <30 nm in diameter.

37. Method according to aspect 36, wherein in step a)
the counter-cations of the hydrogen sulfite anions are ammonium cations as defined in any of aspects 2 to 8, so that after said addition of hydrogen sulfite anions to said double-bonds of one or more α,β-unsaturated esters the one or more ammonium salts as defined in any of aspects 1 to 15 are constituted
or
the counter-cations of the hydrogen sulfite anions are not ammonium cations as defined in any of aspects 2 to 8, and the counter-cations are exchanged against ammonium cations as defined in any of aspects 2 to 8 in a subsequent step, so that the one or more ammonium salts as defined in any of aspects 2 to 15 are constituted
or
the counter-cations of the hydrogen sulfite anions are not ammonium cations, and the counter-cations are exchanged against ammonium cations in a subsequent step, so that the one or more ammonium salts as defined in any of aspects 1 to 15 are constituted.

38. Method according to aspect 37, wherein in a subsequent step
the counter-cations are exchanged against ammonium cations as defined in any of aspects 2 to 8,
so that the one or more ammonium salts as defined in any of aspects 2 to 15 are constituted.

39. Method according to any of aspects 36 or 38, comprising the step of
c) filtering the formulation obtained in step b) through a filter with pore size of <30 nm in diameter,
and comprising as a further step
d) mixing the filtered formulation with additional water to give a diluted aqueous formulation.

40. Method according to any of aspects 36 to 39, wherein the water added is electronic grade water.

41. Method according to any of aspects 35 to 40, wherein the resulting one or more corresponding diester or triester anions are selected from the group consisting of
(sulfomethyl)-butanedioic acid diester anion,
methyl-sulfobutanedioic acid diester anion,
sulfoglutaric acid diester anion,
and
sulfotricarballic acid triester anion.

The present invention is further described by reference to the following examples and figures.

FIGURES

FIG. 1: AFM-Image of a photoresist (line=26 nm and pitch=78 nm) after rinsing with deionized water.

Figure 2:
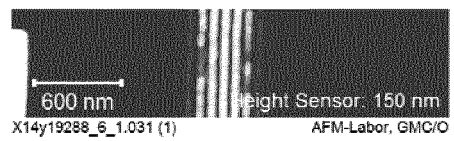

FIG. 2: AFM-Image of a photoresist (line=26 nm and pitch=78 nm) after rinsing with a formulation of the invention containing ammonium di(3,5,5-trimethylhexyl) sulfobutanedioic acid diester [wherein both R groups=3,5,5-trimethylhexyl and n=0].

Figure 3:
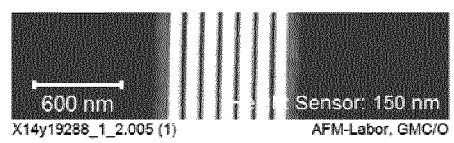

FIG. 3: AFM-Image of a photoresist (line=40 nm and pitch=120 nm) after rinsing with deionized water FIG. 4: AFM-Image of a photoresist (line=40 nm and pitch=120 nm) after rinsing with a formulation of the invention containing ammonium di(3,5,5-trimethylhexyl) sulfobutanedioic acid [wherein both R groups=3,5,5-trimethylhexyl and n=0].

Figure 5:
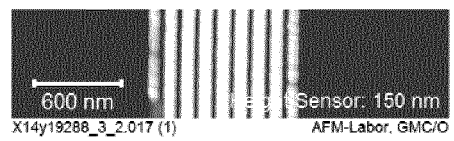

FIG. 5: AFM-Image of a photoresist (line=40 nm and pitch=120 nm) after rinsing with a formulation of the invention containing 2-hydroxyethyl-trimethylammonium di(3,5,5-trimethylhexyl) sulfobutanedioic acid diester [wherein both R groups=3,5,5-trimethylhexyl and n=0].

EXAMPLES

Branching Factor (Determination Method):

The branching factor is determined by $^1$H-NMR spectroscopy according to the method disclosed in WO 2009/124922 A1. In a first step, the alcohol, of which the branching factor has to be determined, is reacted with trichloracetylisocyanate (TAI) forming the corresponding carbaminacid ester. In a second step, the NMR spectrum of the formed carbaminacid ester is measured. The area of the proton signals of the methyl groups between 1 and 0.4 ppm ($F(CH_3)$) is compared to the area of the proton signals corresponding to the primary alcohol between 4.7 and 4 ppm ($F(CH_2-OH)$). The branching factor is calculated according to the following formula:

$$\text{branching factor} = ((F(CH_3)/3)/(F(CH_2-OH)/2))-1.$$

CMC (Critical Micelle Concentration) (Determination Method):

The CMC was determined with a Kruess Tensiometer K 100 according to the plate method by measuring the equilibrium surface tension of a series of aqueous surfactant solutions having different concentrations. The resulting graph has usually two distinct regions. Below the CMC, the equilibrium surface tension linearly depends in a wide range on the logarithm of the surfactant concentration. Above the CMC, the equilibrium surface tension is more or less independent from the concentration of the surfactant. The data points of both regions can statistically be fitted by means of a simple linear regression. The CMC is the intersection between the two linear regression lines fitted to the data in these regions.

For experimental data see below Table 1.

Equilibrium Surface Tension (Measurement According to DIN 53914; Experiments):

The equilibrium surface tension of aqueous surfactant solutions was determined at 25° C. according to DIN 53914 with a Kruess Tensiometer K 100 by the plate method.

The plate method uses a thin plate usually in the order of a few square centimeters in area. The plate is usually made from platinum having a high surface energy to ensure complete wetting. The force F on the plate due to wetting is measured via a tensiometer or microbalance and used to calculate the equilibrium surface tension using the Wilhelmy equation:

$$\gamma = \frac{F}{l \cdot \cos(\theta)}$$

where $l$ is the wetted perimeter of the Wilhelmy plate and $\theta$ is the contact angle between the liquid phase and the plate.

For experimental data see below Table 1.

TABLE 1

| Entry | surfactant | critical micelle concentration (mol/l) | equilibrium surface tension (mN/m) at the corresponding critical micelle concentration |
|---|---|---|---|
| 1 | 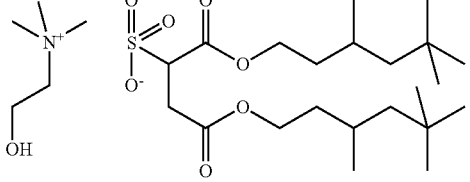 | 1.08 | 23.8 |
| 2 | 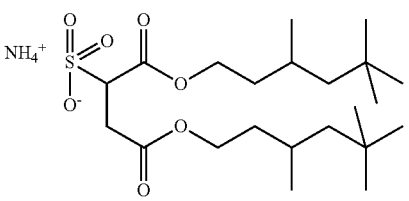 [SMILES: [NH4+] ; CC(CCOC(=O)CC(C(=O)OCCC(C)CC(C)(C)C)S(=O)(=O)[O-])CC(C)(C)C] | 1.28 | 24.1 |
| 3 | 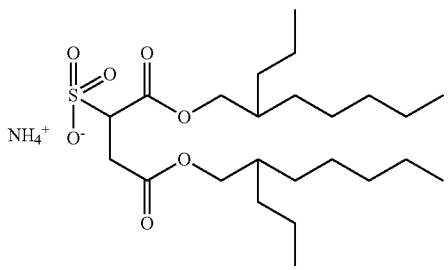 [SMILES: [NH4+] ; CCCCCC(CCC)COC(=O)CC(C(=O)OCC(CCC)CCCCC)S(=O)(=O)[O-]] | 0.81 | 27.5 |
| 4 | 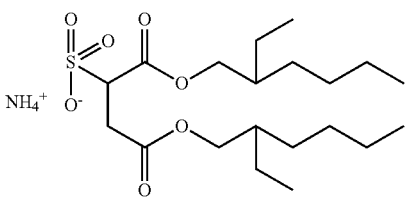 [SMILES: [NH4+] ; CCCCC(CC)COC(=O)CC(C(=O)OCC(CC)CCCC)S(=O)(=O)[O-]] | 3.19 | 26.4 |

TABLE 1-continued

| Entry | surfactant | critical micelle concentration (mol/l) | equilibrium surface tension (mN/m) at the corresponding critical micelle concentration |
|---|---|---|---|
| 5 | pure water | — | 72.8 |
| 6 | 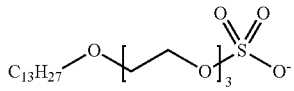 | 0.7 | 35 |

In table 1, the equilibrium surface tensions of specific compounds (as defined in the claims or as reference, respectively) determined at the respective critical micelle concentration are stated. The equilibrium surface tensions of compounds as defined in the claims (first four entries in table 1) are in the range of 23.8 to 27.5 mN/m. These values are surprisingly very low, considering that the compounds are surfactants with aliphatic moieties.

The final two entries in table 1 (pure water and $iC_{13}H_{27}O$—$(CH_2CH_2O)_3SO_3NH_4$) are reference compounds for comparison. Pure water has a much higher equilibrium surface tension (around 73 mN/m). The last entry shows an alkyl ether sulfate with protonated ammonia as counter ion ($iC_{13}H_{27}O$—$(CH_2CH_2O)_3SO_3NH_4$) in water. The equilibrium surface tension (35 mN/m) is much higher compared to the formulations according to the present invention.

The applicant has conducted further measurements according to DIN 53914 with ammonium salts of (sulfomethyl)-butanedioic acid diesters, methyl-sulfobutanedioic acid diesters, sulfoglutaric acid diesters, and sulfotricarballic acid triesters. The results of these further measurements have been very similar to those described in table 1 above with ammonium salts of sulfobutanedioic acid diesters.

Foam Beating Volume (Measurement Method According to DIN 53902; Experiments):

200 ml of 0.5 g/l surfactant solution (see table 2 for (i) corresponding surfactants used in experiments and (ii) individually selected variation of concentration) is placed into a scaled 1000 ml measuring cylinder at 23° C. Foam is created by manually pushing a perforated disc with a frequency of 1 Hz 30 times from the 1000 ml mark to the bottom of the cylinder. The perforated disc has a diameter of 48 mm. The uniformly distributed 60 holes in the disk have a diameter of 1 mm. The foam volume above the aqueous solution is detected as function of time. In table 2 the foam volume above the aqueous solution after 200 sec is stated.

For experimental data see table 2, below:

TABLE 2

| Entry | surfactant | foam volume ((cm³) after 200 sec) |
|---|---|---|
| 1 | 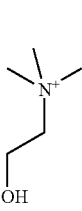 | 220 |
| 2 | 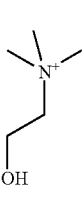 | 100* |
| 3 |  | 290 |

TABLE 2-continued

| Entry | surfactant | foam volume ((cm³) after 200 sec) |
|---|---|---|
| 4 | (structure: bis-branched alkyl sulfosuccinate, NH$_4^+$ salt) | 190 |
| 5 | (structure: bis(2-ethylhexyl) sulfosuccinate, NH$_4^+$ salt) | 130 |
| 6 | C$_{13}$H$_{27}$–O–(CH$_2$CH$_2$O)$_3$–SO$_3^-$ NH$_4^+$ | 190 |
| 7 | Marlon PS (sodium C$_{13}$C$_{17}$-paraffin sulfonate, CAS 93763-92-9) | 800** |

*surfactant compound is identical to the compound used according to first entry of table 2; in second entry foam volume after 200s at 0.2 g/l surfactant concentration is stated
**initial foam at 40° C. and at surfactant concentration 1 g/l from D. Balzer et al, Surfactant Science Series Vol. 91, New York 2000, page 263, table 31

In table 2, data regarding the foam formation of different surfactants as described above and surfactants as known in the prior art are shown. A solution comprising ammonium salt of bis(2-ethylhexyl)sulfosuccinate (entry 5, a formulation according to the present invention, i.e. a composition comprising ammonium salt(s) as defined above) shows the lowest foam formation. Similar results are obtained for the other formulations according to the present invention (i.e. compositions comprising ammonium salt(s) as described above; entry 1 to 4). Foam volume values of formulations according to the present invention are much lower compared to the very high value of the surfactant known in the prior art (commercial surfactant Marlon PS).

Consequently, formulations according to the present invention (i.e., compositions comprising ammonium salt(s) as defined above) have a lower foam volume compared to surfactant formulations known in the prior art.

Furthermore, according to the results in table 2, the surfactant solutions cause foam formation to some extent, but a comparison of entry 1 with entry 2 shows that foam formation is reduced when the concentration of the corresponding surfactant is reduced.

The applicant has conducted further measurements according to DIN 53902 with ammonium salts of (sulfomethyl)-butanedioic acid diesters, methyl-sulfobutanedioic acid diesters, sulfoglutaric acid diesters, and sulfotricarballic acid triesters. The results of these further measurements have been very similar to those described in table 2 above with ammonium salts of sulfobutanedioic acid diesters.

Dynamic Surface Tension (Measurement According to ASTM D 3825-90; Experiments)

The dynamic surface tension was determined by the maximum bubble pressure method with a Lauda MPT 2 instrument. Air is pumped through a capillary into a surfactant solution. The instrument measures the maximum pressure in the air bubbles detaching from the capillary which is reached when the bubble radius equals the capillary radius. The dynamic surface tension is calculated by the LaPlace equation $$p = 2\sigma/r$$

wherein p is the maximum pressure in the bubble, corresponding to the radius r of the capillary and $\sigma$ is the dynamic surface tension between air bubble and surfactant solution.

The bubble frequency is varied by changing the air flow. The higher the bubble frequency, the less time the surfactants have to migrate to the bubble surface in order to lower the dynamic surface tension around the bubble. From the variation of the bubble frequency a time axis for the bubble surface age is created ranging from milliseconds to seconds. The dynamic surface tension as function of time is plotted at constant surfactant concentration (0.5 g/l) and constant ambient temperature. In table 3, the corresponding dynamic surface tensions after 1 sec are stated.

For experimental data see table 3 below:

TABLE 3

| Entry | surfactant | Dynamic surface tension (mN/m) at 1 s for aqueous surfactant formulation with concentration of 0.5 g/l |
|---|---|---|
| 1 | [structure: 2-hydroxyethyl-trimethylammonium di(3,5,5-trimethylhexyl) sulfobutanedioic acid diester] | 27 |
| 2 | [structure: ammonium di(3,5,5-trimethylhexyl) sulfobutanedioate] | 28 |
| 3 | [structure: ammonium di(2-propylheptyl) sulfobutanedioate] | 29 |
| 4 | only water | 73 |
| 5 | [structure: $C_{13}H_{27}$-O-(CH$_2$CH$_2$O)$_3$-SO$_3^-$ NH$_4^+$] | 48 |

The results in table 3 show dynamic surface tensions of different formulations according to the present invention (i.e. compositions comprising ammonium salt(s) as defined above). The dynamic surface tensions of different formulations according to the present invention (i.e. compositions comprising ammonium salt(s) as defined above) after 1 s are below 30 mN/m (and with increasing time decrease even further). The last two entries in table 3 are provided for comparison. Pure water has a much higher dynamic surface tension (around 73 mN/m) than formulations according to the present invention (i.e. compositions comprising ammonium salt(s) as defined above). The last entry in table 3 shows an alkyl ether sulfate with protonated ammonia as counter-ion which is dissolved in water. The dynamic surface tension after 1 s (48 mN/m) is much higher in comparison to formulations according to the present invention (i.e. compositions comprising ammonium salt(s) as defined above). With respect to the described use (for cleaning or rinsing a product comprising a substrate and supported thereon a patterned material layer having line-space structures with a line width of 50 nm or below), the formulations according to the present invention (i.e. compositions comprising ammonium salt(s) as defined above) are advantageous as the cycle time can be kept short.

The applicant has conducted further measurements according to ASTM D 3825-90 with ammonium salts of (sulfomethyl)-butanedioic acid diesters, methyl-sulfobutanedioic acid diesters, sulfoglutaric acid diesters, and sulfotricarballic acid triesters. The results of these further measurements have been very similar to those described in table 3 above with ammonium salts of sulfobutanedioic acid diesters.

NTU-Value of Aqueous Solutions (Determination Method):

NTU-value is determined according to the EPA method 180.1, e.g. with a HACH Lange 2100 G instrument.

For example, for a solution of 1 g/l 2-hydroxyethyl-trimethylammonium di(3,5,5-trimethylhexyl) sulfobutanedioic acid diester (surfactant from synthesis part 4b) in DIW (electronic grade water, which means de-ionized water) in presence of 1 g/l 1-methoxy-2-propanol a NTU-value of 0.3 was measured.

For water (DIW) a NTU-value of 0.08 was measured.

Photoresist Swelling and Pattern Collapse (Determination Method; Experiments):

Pattern collapse and photoresist swelling were determined by use of AFM (atomic force microscopy) inspection. Silicon wafers were provided with 100 nm thick layers of an immersion photoresist. The provided photoresist layers were exposed to UV radiation of a wavelength of 193 through a mask using ultrapure water as the immersion liquid. Due to the mask, patterns resulted having line-space structures with
- (A) a line width of 26 nm and a space width of 52 nm (photoresist layer "L26 P78") and an aspect ratio of about 4, and
- (B) with line width 40 nm and space width of 80 nm (photoresist layer "L40 P120") and an aspect ratio of about 2.5.

The space between the photoresist lines was (A) 52 nm [L(line) 26 nm P(pitch) 78 nm] and (B) 80 nm [L(line) 40 nm P(pitch) 120 nm].

Thereafter, the exposed photoresist layers (A) and (B) were baked and developed with an aqueous developer solution containing TMAH (tetramethylammonium hydroxide). The baked and developed photoresist layers were individually subjected to a chemical rinse treatment using one of the following three chemical rinse solution containing
- (a) DIW (de-ionized water),
- (b) 0.05 wt.-% ammonium di(3,5,5-trimethylhexyl) sulfobutanedioic acid diester in DIW (a formulation according to the present invention or a composition comprising ammonium salt(s) as described above),
- (c) 0.05 wt.-% 2-hydroxyethyl-trimethylammonium di(3, 5,5-trimethylhexyl) sulfobutanedioic acid diester in DIW (a formulation according to the present invention or a composition comprising ammonium salt(s) as described above)

in different proportions. Each surfactant solution contained similar amounts (on weight basis) of 1-methoxy-2-propanol (which is used as an organic (co-)solvent) compared to the amount of surfactant.

Each chemical rinse solution was applied as a puddle. Thereafter, the silicon wafers were spun dry.

Experimental Data:

Pattern Collapse:

It can be concluded from the experimental data stated in Table 4 below that photoresist layer (B) ("L40 P120") did not show any pattern collapse when treated with chemical rinse solutions (b) and (c): all nine lines present before rinsing are still visible after rinsing; see also FIGS. 4 and 5. In comparison, in the photoresist layer (B) rinsed with a DIW solution, only seven out of a theoretical total number of nine lines are visible.

Photoresist (A) ("L26 P78") showed a reduced number of collapsed patterns when treated with chemical rinse solution (b): still five out of a theoretical total number of seven lines are visible (see also FIG. 2) in comparison to a photoresist rinsed with a DIW solution where only three out of the total number of seven lines are visible (see also FIG. 1).

For experimental data see table 4 below:

Thus, formulations of the present invention and/or compositions used according to the present invention significantly reduce pattern collapse or even prevent pattern collapse.

Swelling:

For experimental data see FIGS. 1 to 5 below and table 4 above:

FIG. 1-5 show the top down pictures obtained via AFM after the rinse treatment with DIW and solutions comprising ammonium di(3,5,5-trimethylhexyl) sulfobutanedioic acid diester and 2-hydroxyethyl-trimethylammonium di(3,5,5-trimethylhexyl) sulfobutanedioic acid diester. The dried patterned photoresist layers having patterns with line-width of (A) 26 nm, space of 52 nm (pitch of 78 nm) and an aspect ratio of about 4 showed significant pattern collapse and line width of (B) 40 nm and space of 80 nm (pitch of 120 nm).

Figure 4:
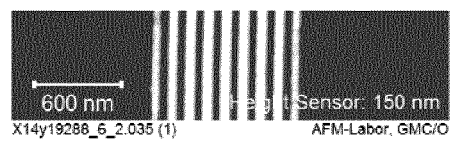

For L40 P120, only slight swelling (when using a solution comprising 2-hydroxyethyl-trimethylammonium di(3,5,5-trimethylhexyl) sulfobutanedioic acid diester; see also FIG. 5) or no swelling (when using a solution comprising ammonium di(3,5,5-trimethylhexyl) sulfobutanedioic acid diester; see also FIG. 4) was observed by the microscopic methods as described above.

For L26 P78, only slight swelling (when using a solution comprising ammonium di(3,5,5-trimethylhexyl) sulfobutanedioic acid diester) was observed by the microscopic methods as described above (see also FIG. 2).

For both photoresists (L26 P78 and L40 P120), swelling was observed when using DIW as rinsing solution (see also FIGS. 1 and 3).

Thus, the use of formulations of the present invention and/or compositions as described above significantly reduce or even prevent (depending on size of patterned structures) swelling of the photoresist compared to the benchmark rinse with DIW.

The applicant has conducted further measurements on photoresist swelling and pattern collapse with ammonium salts of (sulfomethyl)-butanedioic acid diesters, methylsulfobutanedioic acid diesters, sulfoglutaric acid diesters, and sulfotricarballic acid triesters. The results of these further measurements have been very similar to those described in table 4 above with ammonium salts of sulfobutanedioic acid diesters.

Watermark Defects, Blob Defects, Particle Removal (Determination Method; Experiments):

Particle removal was investigated by scanning the surface of the patterned material layer of a wafer. The wafer was prepared using a Sokudo Duo track attached to an ASML Twinscan NXT:1950i scanner.

A typical process for the preparation of a corresponding patterned material layer (including the use of a composition according to the present invention or a formulation of the present invention) included a pre-bake at 250° C. for 60 s and an HMDS coating with a bake at 110° C. for 50° C.

TABLE 4

| Line space dimension | number of lines before rinsing | Number of lines after DIW rinse | Number of lines after rinsing with a solution comprising 2-hydroxyethyl-trimethylammonium di(3,5,5-trimethylhexyl) sulfobutanedioic acid diester | Number of lines after rinsing with a solution comprising ammonium di(3,5,5-trimethylhexyl) sulfobutanedioic acid diester rinse |
|---|---|---|---|---|
| L26 P78 | 7 | 3 (swelling) (see FIG. 1) | Not measured | 5 (no swelling) (see FIG. 2) |
| L40 P120 | 9 | 7 (swelling) (see FIG. 3) | 9 (slight swelling) (see FIG. 5) | 9 (no swelling) (see FIG. 4) |

Afterwards, 95 nm of Brewer Science ARC29SR as BARG (bottom anti-reflective coating) was coated and baked at 205° C. for 60 s. This was followed by the resist coating either of a 105 nm TOK pi-6001 or a JSR AIM 5484 resist. The resists were baked at 120° C. for 60° C. and the TOK resist got an additional top coating. The exposure was performed in a dipole field. After scanning of the resists, the wafers were soaked, cleaned and baked at 100° C. For manual rinse experiments the wafers were afterwards transferred to a FOSB (front opening shipping box) and shipped to the lab. The wafers where then developed with a 2.38 wt.-% TMAH solution and the test solutions were used in a wet to wet process.

After the application of the rinse solution by manual dispense (DIW (de-ionized water; entry 4 in table 5) vs. aqueous solutions of 0.05 wt.-% 2-hydroxyethyl-trimethyl-ammonium di(3,5,5-trimethylhexyl) sulfobutanedioic acid diester (surfactant), 0.05 wt.-% 1-methoxy-2-propanol (co-solvent) and 0.0002 wt.-% N,N-dimethylmyristylamine oxide (entries 1 and 2 in table 5) or 0.0002 wt.-% 1-octanol (entry 3 in table 5)) the wafers were spin dried.

Instruments used for inspection were:
AFM
SEM (Hitachi CG-5000)
Defect Scan (KLA 2385 or similar) optional SEM-Vision for defect review (defect map)

After the wafers were spin-dried the wafers were inspected for defects. The following data were generated on KLA2385 (KLA Tencor).

For experimental data see table 5 below:
Watermark Defects:
It was corroborated by scanning electron microscopy (SEM, Hitachi CG-5000) and atomic force microscopy (AFM) that the dried silicon wafers did not show any watermarks.
Particle Removal:

TABLE 5

| Entry | chemical composition of surfactant solution (wt.-% values are based on the total weight of the rinsing solution) | Number of particles remaining on the resist surface after rinsing with surfactant solution | rinsing mode |
|---|---|---|---|
| 1 | Surfactant (0.05 wt.-%) + Co-solvent (0.05 wt.-%) + N,N-dimethylmyristylamine oxide (0.0002 wt.-%) | 343 | manual rinse |
| 2 | Surfactant (0.05 wt.-%) + Co-solvent (0.05 wt.-%) + N,N-dimethylmyristylamine oxide (0.0003 wt.-%) | 262 | manual rinse |
| 3 | Surfactant (0.05 wt.-%) + Co-solvent (0.05 wt.-%) + 1-octanol (0.0002 wt.-%) | 189 | manual rinse |
| 4 | DIW Reference + DIW | 477 | manual DIW rinse | surfactant = 2-hydroxyethyl-trimethylammonium di(3,5,5-trimethylhexyl) sulfobutanedioic acid diester;
co-solvent = 1-methoxy-2-propanol In the last entry (entry 4) of table 5, it can be seen that 477 particles remain after rinsing of photoresists as prepared according to the procedure described above with a DIW solution. In entries 1 to 3, it can be seen that significantly less particles remain on the surface of the photoresist (i.e. a product comprising a substrate and supported thereon a patterned material layer having line-space structures with a line width of 50 nm or below) after cleaning or rinsing with a solution or a composition according to the invention. The cleaned or rinsed photoresist is a product of the method of the present invention for making a cleaned or rinsed product comprising a substrate and supported thereon a patterned material layer having line-space structures with a line width of 50 nm or below.

As shown in table 5, formulations of the present invention and/or compositions used according to the present invention result in a significantly reduced amount of particles remaining on the surface of the photoresist compared to photoresists rinsed with DIW. This is also advantageous for the reduction of watermark defects and reduction of blob defects.

The applicant has conducted further measurements on the removal of watermark defects, blob defects and particles with ammonium salts of (sulfomethyl)-butanedioic acid diesters, methyl-sulfobutanedioic acid diesters, sulfoglutaric acid diesters, and sulfotricarballic acid triesters. The results of these further measurements have been very similar to those described in table 5 above with ammonium salts of sulfobutanedioic acid diesters.

Synthesis

1) Maleic Acid Diester/Fumaric Acid Diester a) Maleic Acid di(2-ethylhexyl)ester Mixed with Fumaric Acid di(2-ethylhexyl)ester A 2 liter 4-necked round bottom flask, equipped with blade agitator, PT100-thermo element, reflux condenser and water separator, was charged with 390.68 g (3 mol, 2.0 eq) 2-ethyl-1-hexanol (technical, purity >95 wt.-%, provider BASF), 6 g (0.0315 mol, 0.021 eq) p-toluene sulfonic acid monohydrate, and 450 g toluene, and stirred at 20° C. Temperature was increased to 40° C. and 147.09 g (1.5 mol, 1.0 eq) maleic acid anhydride was added portion wise. Within 1 h temperature was increased to 126° C. and the reaction water was removed by the water separator. After 48 h the theoretical amount of water was separated. Reaction mixture was cooled to 50° C. and was transferred to a separating funnel. At 50° C., organic layer was washed three times with 266 g water each. Afterwards, organic phase was isolated, dried over sodium sulfate, and filtered through a Seitz K900 filter. In a rotary evaporator toluene was removed at 90° C. and <10 mbar. 480 g of a yellow liquid was received (yield 94 mol % (with respect to theoretical amount of desired ester structures)). $^1$H-NMR-spektroscopy in CDCl$_3$ and MeOD confirmed formation of the desired maleic acid diester and its structural isomer fumaric acid diester (isomerization due to thermal stress; maleic acid diester:fumaric acid diester=84:16) and showed complete degree of esterification.

a') Maleic Acid di(2-ethylhexyl)ester Mixed with Fumaric Acid di(2-ethylhexyl)ester A 1 liter 4-necked round bottom flask, equipped with blade agitator, PT100-thermo element, reflux condenser and water separator, was charged with 150.5 g (1.158 mol, 2.0 eq) 2-ethyl-1-hexanol (technical, purity >95 wt.-%, provider BASF), 4.4 g (0.0232 mol, 0.04 eq) p-toluene sulfonic acid monohydrate, 191 g toluene, and 56.7 g (0.579 mol, 1.0 eq) maleic acid anhydride, and stirred at 20° C. Temperature was increased to 123-125° C. and a nitrogen stream was flowed over the liquid. The reaction water was removed by the water separator. After 12 h the theoretical amount of water was separated. Reaction mixture was cooled to 50° C. and was transferred to a separating funnel. At 50° C., organic layer was washed three times with 127 g water each. Afterwards, organic phase was isolated, and in a rotary evaporator toluene was removed at 90° C. and <10 mbar. Afterwards the product was filtered through a Seitz K900 filter. 185 g of a yellowish liquid was received (yield 94 mol % (with respect to theoretical amount of desired ester structures)). $^1$H-NMR-spektroscopy in CDCl$_3$ and MeOD confirmed formation of the desired maleic acid diester and its structural isomer fumaric acid diester (isomerization due to thermal stress; maleic acid diester:fumaric acid diester=92:8) and showed complete degree of esterification.

b) Maleic Acid di(3,5,5-trimethyl-1-hexyl)ester Mixed with Fumaric Acid di(3,5,5-trimethyl-1-hexyl)ester A 2 liter 4-necked round bottom flask, equipped with blade agitator, PT100-thermo element, reflux condenser and water separator, was charged with 390.35 g (2.692 mol, 2.0 eq) 3,5,5-trimethyl-1-hexanol (technical, purity >85 wt.-%, rest structural isomers, provider Oxea), 5.4 g (0.0284 mol, 0.02 eq) p-toluene sulfonic acid monohydrate, and 450 g toluene, and stirred at 20° C. Temperature was increased to 40° C. and 131.99 g (1.346 mol, 1.0 eq) maleic acid anhydride was added portion wise. Within 1 h temperature was increased to 125° C. and the reaction water was removed by the water separator. After 67 h the theoretical amount of water was separated. Reaction mixture was cooled to 50° C. and was transferred to a separating funnel. At 50° C., organic layer was washed three times with 300 g water each. Afterwards, organic phase was isolated, dried over sodium sulfate, and filtered through a Seitz K900 filter. In a rotary evaporator toluene was removed at 90° C. and <10 mbar. 468 g of a yellow liquid was received (yield 94 mol % (with respect to theoretical amount of desired ester structures)). $^1$H-NMR-spektroscopy in CDCl$_3$ and MeOD confirmed formation of the desired maleic acid diester and its structural isomer fumaric acid diester (isomerization due to thermal stress; maleic acid diester:fumaric acid diester=80:20) and showed complete degree of esterification.

b') Maleic Acid di(3,5,5-trimethyl-1-hexyl)ester Mixed with Fumaric Acid di(3,5,5-trimethyl-1-hexyl)ester A 1 liter 4-necked round bottom flask, equipped with blade agitator, PT100-thermo element, reflux condenser and water separator, was charged with 166.8 g (1.158 mol, 2.0 eq) 3,5,5-trimethyl-1-hexanol (technical, purity >85 wt.-%, rest structural isomers, provider Oxea), 4.4 g (0.0232 mol, 0.04 eq) p-toluene sulfonic acid monohydrate, 191 g toluene, and 56.7 g (0.579 mol, 1.0 eq) maleic acid anhydride, and stirred at 20° C. Temperature was increased to 123-125° C. and a nitrogen stream was flowed over the liquid. The reaction water was removed by the water separator. After 12 h the theoretical amount of water was separated. Reaction mixture was cooled to 50° C. and was transferred to a separating funnel. At 50° C., organic layer was washed three times with 127 g water each. Afterwards, organic phase was isolated, and in a rotary evaporator toluene was removed at 90° C. and <10 mbar. Afterwards the product was filtered through a Seitz K900 filter. 202 g of a yellowish liquid was received (yield 94 mol % (with respect to theoretical amount of desired ester structures)). $^1$H-NMR-spektroscopy in CDCl$_3$ and MeOD confirmed formation of the desired maleic acid diester and its structural isomer fumaric acid diester (isomerization due to thermal stress; maleic acid diester:fumaric acid diester=93:7) and showed complete degree of esterification.

c) Maleic Acid di(isononyl)ester Mixed with Fumaric Acid di(isononyl)ester

A 2 liter 4-necked round bottom flask, equipped with blade agitator, PT100-thermo element, reflux condenser and water separator, was charged with 389.4 g (2.699 mol, 2.0 eq) Nonanol N (technical, purity >95 wt.-%, provider BASF), 5.4 g (0.0282 mol, 0.021 eq) p-toluene sulfonic acid monohydrate, and 450 g toluene at 20° C. Temperature was increased to 40° C. and 132.3 g (1.350 mol, 1.0 eq) maleic acid anhydride was added portion wise under stirring. Temperature was increased to 126° C. The reaction water was removed by the water separator. After 72 h the theoretical amount of water was separated. Reaction mixture was cooled to 50° C. and was transferred to a separating funnel. At 50° C., organic layer was washed three times with 266 g water each. Afterwards, organic phase was isolated, and in a rotary evaporator toluene was removed at 90° C. and <10 mbar. Afterwards the product was filtered through a Seitz K900 filter. 472 g of a yellowish liquid was received (yield 95 mol % (with respect to theoretical amount of desired ester structures)). $^1$H-NMR-spektroscopy in CDCl$_3$ and MeOD confirmed formation of the desired maleic acid diester and its structural isomer fumaric acid diester (isomerization due to thermal stress; maleic acid diester:fumaric acid diester=83:17) and showed complete degree of esterification.

d) Maleic Acid di(2-propylheptyl)ester Mixed with Fumaric Acid di(2-propylheptyl)ester A 2 liter 4-necked round bottom flask, equipped with blade agitator, PT100-thermo element, reflux condenser and water separator, was charged with 427.4 g (2.7 mol, 2.0 eq) 2-propyl-1-heptanol (technical, purity >95 wt.-%, provider BASF), 5.4 g (0.0282 mol, 0.021 eq) p-toluene sulfonic acid monohydrate, and 450 g toluene at 20° C. Temperature was increased to 40° C. and 132.3 g (1.350 mol, 1.0 eq) maleic acid anhydride was added portion wise under stirring. Temperature was increased to 126° C. and a nitrogen stream was flowed over the liquid. The reaction water was removed by the water separator. After 8 h the theoretical amount of water was separated. Reaction mixture was cooled to 50° C. and was transferred to a separating funnel. At 50° C., organic layer was washed three times with 200 g water each. Afterwards, organic phase was isolated, and in a rotary evaporator toluene was removed at 90° C. and <10 mbar. Afterwards the product was filtered through a Seitz K900 filter. 527 g of a yellowish liquid was received (yield 94 mol-% (with respect to theoretical amount of desired ester structures)). $^1$H-NMR-spektroscopy in CDCl$_3$ and MeOD confirmed formation of the desired maleic acid diester and its structural isomer fumaric acid diester (isomerization due to thermal stress; maleic acid diester:fumaric acid diester=95:5) and showed complete degree of esterification.

2) Dialkyl Sulfosuccinate Ammonium Salt (i.e. Ammonium Salts of Sulfobutanedioic Acid Dialkyl Diester)

a) Di(2-ethylhexyl) sulfosuccinate Ammonium Salt

A 2 liter 4-necked round bottom flask, equipped with blade agitator, PT100-thermo element, reflux condenser, was charged with 340.5 g (1.0 mol, 1.0 eq) of 84:16 mixture out of maleic acid di(2-ethylhexyl)ester and fumaric acid di(2-ethylhexyl)ester and 432 g of methoxy-2-propanol (electronic grade) and stirred at 20° C. Temperature was increased to 105° C. and over next two hours 177 g (1.25 mol ammonium hydrogen sulfite, 1.25 eq) of a solution of ammonium hydrogen sulfite (70 wt.-% in water) was added continuously. During dosage, the temperature changed between 100 and 105° C. and water boiled under reflux. Reaction mixture was decreased to 100° C. and stirred for 4 h at 100° C. Analytic of crude product by $^1$H-NMR-spektroscopy in $CDCl_3$ and MeOD confirmed formation of the desired structure and complete elimination of the double bond due to addition of sulfite. The diester function remained untouched. A nitrogen stream (1.5 fold reactor volume per hour) was flowed over the liquid and the water was removed by azeotropic distillation at 80 to 100° C. and under reduced pressure from 800 to 250 mbar. In order to compensate the loss of methoxy-2-propanol, two times 216 g methoxy-2-propanol (electronic grade) each was added. Goal was to have an active content of roughly 50 to 55 weight-% of the corresponding sulfosuccinate ammonium salt. Reaction mixture was cooled down to 15° C. filtered through a Seitz K150 filter in order to remove insoluble salts. One obtained 754 g of a solution. The solution contained 54.6 wt.-% of the desired compound, 45.1 wt.-% of methoxy-2-propanol and 0.3 wt.-% of water. The solution contained the desired structure as shown again by $^1$H-NMR-spektroscopy in $CDCl_3$ and MeOD. Content of water was determined by Karl-Fischer-analysis. Content of methoxy-2-propanol was determined by quantitative gas chromatography. Yield of desired structure was 94 mol % (with respect to theoretical amount of desired surfactant structures) (some loss of material due to filtration and removal of insoluble salt, at which minor parts of surfactant have been adsorbed). The solution was stored for 3 weeks at 2° C. The solution was clear and did not show any precipitation. Metal ion content was <10 ppm.

b) Di(3,5,5-trimethylhexyl) sulfosuccinate Ammonium Salt

A 2 liter 4-necked round bottom flask, equipped with blade agitator, PT100-thermo element, reflux condenser, was charged with 313.0 g (0.85 mol, 1.0 eq) of 80:20 mixture out of maleic acid di(3,5,5-trimethylhexyl)ester and fumaric acid di(3,5,5-trimethylhexyl)ester and 86.41 g of neopentyl glycol and stirred at 20° C. Temperature was increased to 115° C. and over next two hours 150.44 g (1.0625 mol ammonium hydrogen sulfite, 1.25 eq) of a solution of ammonium hydrogen sulfite (70 wt.-% in water) was added continuously. During dosage, the temperature dropped down to 103° C. and water boiled under reflux. Reaction mixture was decreased to 100° C. and stirred for 4 h at 100° C. Analytic of crude product by $^1$H-NMR-spektroscopy in $CDCl_3$ and MeOD confirmed formation of the desired structure and complete elimination of the double bond due to addition of sulfite. The diester function remained untouched. Reaction mixture was cooled down to 90° C. and 171.17 g of water was added. After further temperature decrease down to 80° C. 171.16 g of butyl diethylene glycol was added. After 10 min stirring at 80° C. reaction mixture was transferred into a separation funnel and the lower phase (7.9 g) was removed. (7.9 g). The upper phase (875 g) contained 44.5 weight percent of the desired structure (as shown again by $^1$H-NMR-spektroscopy in $CDCl_3$ and MeOD), 8.68 weight-% neopentyl glycol, 19.61 weight-% butyl diethylene glycol and 23.5 weight-% water (rest 2.36 wt.-% salts). The solution was stored for 2 weeks at 2° C. The solution was clear and did not show any precipitation.

b') Di(3,5,5-trimethylhexyl) sulfosuccinate Ammonium Salt

A 1 liter 4-necked round bottom flask, equipped with blade agitator, PT100-thermo element, reflux condenser, was charged with 202 g (0.55 mol, 1.0 eq) of 93:7 mixture out of maleic acid di(3,5,5-trimethylhexyl)ester and fumaric acid di(3,5,5-trimethylhexyl)ester and 266 g of methoxy-2-propanol (electronic grade) and stirred at 20° C. Temperature was increased to 105° C. and over next two hours 97 g (0.69 mol ammonium hydrogen sulfite, 1.25 eq) of a solution of ammonium hydrogen sulfite (70 wt.-% in water) was added continuously. During dosage, the temperature changed between 100 and 105° C. and water boiled under reflux. Reaction mixture was decreased to 100° C. and stirred for 4 h at 100° C. Analytic of crude product by $^1$H-NMR-spektroscopy in $CDCl_3$ and MeOD confirmed formation of the desired structure and complete elimination of the double bond due to addition of sulfite. The diester function remained untouched. A nitrogen stream (1.5 fold reactor volume per hour) was flowed over the liquid and the water was removed by azeotropic distillation at 80 to 100° C. and under reduced pressure from 800 to 450 mbar. In order to compensate the loss of methoxy-2-propanol, two times 133 g methoxy-2-propanol (electronic grade) each was added. Goal was to have an active content of roughly 50 to 55 weight-% of the corresponding sulfosuccinate ammonium salt. Reaction mixture was cooled down to 20° C. filtered through a Seitz K150 filter in order to remove insoluble salts. One obtained 458 g of a solution. The solution contained 53.7 wt.-% of the desired compound, 45.8 wt.-% of methoxy-2-propanol and 0.5 wt.-% of water. The solution contained the desired structure as shown again by $^1$H-NMR-spektroscopy in $CDCl_3$ and MeOD. Content of water was determined by Karl-Fischer-analysis. Content of methoxy-2-propanol was determined by quantitative gas chromatography. Yield of desired structure was 96 mol % (with respect to theoretical amount of desired surfactant structures) (some loss of material due to filtration and removal of insoluble salt, at which minor parts of surfactant have been adsorbed). Metal ion content was <10 ppm.

c) Di(isononyl) sulfosuccinate Ammonium Salt

A 1 liter 4-necked round bottom flask, equipped with blade agitator, PT100-thermo element, reflux condenser, was charged with 106.7 g (0.289 mol, 1.0 eq) of 83:17 mixture out of maleic acid di(isononyl)ester and fumaric acid di(isononyl)ester and 135 g of methoxy-2-propanol (electronic grade) and stirred at 20° C. Temperature was increased to 105° C. and over next two hours 51.3 g (0.362 mol ammonium hydrogen sulfite, 1.25 eq) of a solution of ammonium hydrogen sulfite (70 wt.-% in water) was added continuously. During dosage, the temperature changed between 100 and 105° C. and water boiled under reflux. Reaction mixture was decreased to 100° C. and stirred for 4 h at 100° C. Analytic of crude product by $^1$H-NMR-spektroscopy in $CDCl_3$ and MeOD confirmed formation of the desired structure and complete elimination of the double bond due to addition of sulfite. The diester function remained untouched. A nitrogen stream (1.5 fold reactor volume per hour) was flowed over the liquid and the water was removed by azeotropic distillation at 80 to 100° C. and under reduced pressure from 700 to 250 mbar. In order to compensate the loss of methoxy-2-propanol, two times 62 g methoxy-2-propanol (electronic grade) each was added. Goal was to have an active content of roughly 50 to 57 weight-% of the corresponding sulfosuccinate ammonium salt. Reaction mixture was cooled down to 20° C. filtered through a Seitz K150 filter in order to remove insoluble salts. One obtained 220 g of a solution. The solution contained 56.5% of the desired compound, 43.2% of methoxy-2-propanol and 0.3% of water. The solution contained the desired structure as shown again by $^1$H-NMR-spektroscopy in $CDCl_3$ and MeOD. Content of water was determined by Karl-Fischer-analysis. Content of methoxy-2-propanol was determined by quantitative gas chromatography. Yield of desired structure was 92 mol % (with respect to theoretical amount of desired surfactant structures)(some loss of material due to filtration and removal of insoluble salt, at which minor parts of surfactant have been adsorbed). The solution was stored for 2 weeks at 10° C. The solution was clear and did not show any precipitation. Metal ion content was <10 ppm.

d) Di(2-propylheptyl) sulfosuccinate Ammonium Salt

A 1 liter 4-necked round bottom flask, equipped with blade agitator, PT100-thermo element, reflux condenser, was charged with 150 g (0.387 mol, 1.0 eq) of 95:5 mixture out of maleic acid di(2-propylheptyl)ester and fumaric acid di(2-propylheptyl)ester and 190 g of methoxy-2-propanol (electronic grade) and stirred at 20° C. Temperature was increased to 105° C. and over next two hours 66.9 g (0.473 mol ammonium hydrogen sulfite, 1.25 eq) of a solution of ammonium hydrogen sulfite (70 wt.-% in water) was added continuously. During dosage, the temperature changed between 100 and 105° C. and water boiled under reflux. Reaction mixture was decreased to 100° C. and stirred for 4 h at 100° C. Analytic of crude product by $^1$H-NMR-spektroscopy in $CDCl_3$ and MeOD confirmed formation of the desired structure and complete elimination of the double bond due to addition of sulfite. The diester function remained untouched. A nitrogen stream (1.5 fold reactor volume per hour) was flowed over the liquid and the water was removed by azeotropic distillation at 80 to 100° C. and under reduced pressure from 700 to 250 mbar. In order to compensate the loss of methoxy-2-propanol, two times 130 g methoxy-2-propanol (electronic grade) each was added. Goal was to have an active content of roughly 50 to 65 weight-% of the corresponding sulfosuccinate ammonium salt. Reaction mixture was cooled down to 20° C. filtered through a Seitz K150 filter in order to remove insoluble salts. One obtained 220 g of a solution. The solution contained 62.5 wt.-% of the desired compound, 37.2 wt.-% of methoxy-2-propanol and 0.3 wt.-% of water. The solution contained the desired structure as shown again by $^1$H-NMR-spektroscopy in $CDCl_3$ and MeOD. Content of water was determined by Karl-Fischer-analysis. Content of methoxy-2-propanol was determined by quantitative gas chromatography. Yield of desired structure was 91 mol % (with respect to theoretical amount of desired surfactant structures) (some loss of material due to filtration and removal of insoluble salt, at which minor parts of surfactant have been adsorbed). The solution was stored for 2 weeks at 20° C. The solution was slightly scattering but still homogeneous. Metal ion content was <10 ppm.

3) Dialkyl Sulfosuccinate Sodium Salt (not Inventive)

a) Di(2-ethylhexyl) sulfosuccinate Sodium Salt

A 4 liter 4-necked round bottom flask, equipped with blade agitator, PT100-thermo element, reflux condenser, was charged with 55.4 g (0.163 mol, 1.0 eq) of 84:16 mixture out of maleic acid di(2-ethylhexyl)ester and fumaric acid di(2-ethylhexyl)ester and 396 g of 1,4-dioxane and stirred at 20° C. Temperature was increased to 50° C. and over the next one hour 1108.35 g (4.26 mol sodium hydrogen sulfite, 26.15 eq) of a solution of sodium hydrogen sulfite (40 wt.-% in water) was added continuously, which pH-value was adjusted to pH=5 with 19.2 g (0.24 mol, 1.47 eq) of a solution of sodium hydroxide (50 wt.-% in water). Temperature was increased to 88° C. and reaction mixture was stirred for 24 h at 88° C. Afterwards, within 30 min additional 347.87 g (1.441 mol, 8.84 eq) of a solution of sodium hydrogen sulfite (40 wt.-% in water) was added continuously, which pH-value was adjusted to pH=5 with 7 g (0.0875 mol, 0.54 eq) of a solution of sodium hydroxide (50 wt.-% in water). After stirring for 48 h, within 30 minutes additional 347.87 g (1.441 mol, 8.84 eq) of a solution of sodium hydrogen sulfite (40 wt.-% in water) was added continuously, which pH-value was adjusted to pH=5 with 7 g (0.0875 mol, 0.54 eq) of a solution of sodium hydroxide (50 wt.-% in water). After 60 h at 88° C. the reaction mixture was transferred into a separation funnel and the two phases were separated. From the organic phase water and 1,4-dioxane was removed using a rotary evaporator at 90° C. and <10 mbar for 4 hours. As shown by $^1$H-NMR-spektroscopy in $CDCl_3$ and MeOD formation of the desired structure and complete elimination of the double bond due to addition of sulfite occurred. Yield of desired structure was 100 mol % (with respect to present ester structures) and the product was obtained as a mixture with other salts.

b) Di(3,5,5-trimethylhexyl) sulfosuccinate Sodium Salt

A 4 liter 4-necked round bottom flask, equipped with blade agitator, PT100-thermo element, reflux condenser, was charged with 60.0 g (0.163 mol, 1.0 eq) of 80:20 mixture out of maleic acid di(3,5,5-trimethylhexyl)ester and fumaric acid di(3,5,5-trimethylhexyl)ester and 396 g of 1,4-dioxane and stirred at 20° C. Temperature was increased to 50° C. and over the next one hour 1108.35 g (4.26 mol sodium hydrogen sulfite, 26.15 eq) of a solution of sodium hydrogen sulfite (40 wt.-% in water) was added continuously, which pH-value was adjusted to pH=5 with 19.2 g (0.24 mol, 1.47 eq) of a solution of sodium hydroxide (50 wt.-% in water). Temperature was increased to 88° C. and reaction mixture was stirred for 24 h at 88° C. Afterwards, within 30 min additional 347.87 g (1.441 mol, 8.84 eq) of a solution of sodium hydrogen sulfite (40 wt.-% in water) was added continuously, which pH-value was adjusted to pH=5 with 7 g (0.0875 mol, 0.54 eq) of a solution of sodium hydroxide (50 wt.-% in water). After stirring for 48 h, within 30 minutes additional 347.87 g (1.441 mol, 8.84 eq) of a solution of sodium hydrogen sulfite (40% in water) was added continuously, which pH-value was adjusted to pH=5 with 7 g (0.0875 mol, 0.54 eq) of a solution of sodium hydroxide (50 wt.-% in water). After 60 h at 88° C. the reaction mixture was transferred into a separation funnel and the two phases were separated. From the organic phase water and 1,4-dioxane was removed using a rotary evaporator at 90° C. and <10 mbar for 4 hours. As shown by $^1$H-NMR-spektroscopy in CDCl$_3$ and MeOD formation of the desired structure and complete elimination of the double bond due to addition of sulfite occurred. Yield of desired structure was 100 mol % (with respect to present ester structures) and the product was obtained as a mixture with other salts.

4) Dialkyl Sulfosuccinate Choline Salt a) Di(2-ethylhexyl) sulfosuccinate Choline Salt A 4 liter 4-necked round bottom flask, equipped with blade agitator, PT100-thermo element, pH meter, reflux condenser, was charged with 1130 g methoxy-2-propanol and 273 g Amberlyst 15 (ion exchanger, acid form) was added at 20° C., while temperature increased to 28° C. during addition. 180.26 g (0.406 mol, 1.0 eq) di(2-ethylhexyl) sulfosuccinate sodium salt was dissolved in 898.8 g methoxy-2-propanol and filtered through a Seitz K900 filter in order to remove insoluble salts. After 15 min, within 20 min the mentioned 180.26 g (0.406 mol, 1.0 eq) di(2-ethylhexyl) sulfosuccinate sodium salt dissolved in methoxy-2-propanol was added dropwise into the 4 liter 4-necked round bottom flask. Reaction mixture stirred for 4 h at 40° C. and was filtered through a Seitz K900 filter in order to remove insoluble salts.

In a 4 liter 4-necked round bottom flask additional 560 g methoxy-2-propanol were added and 135 g of Amberlyst 15 was added afterwards. Then, the above mentioned filtered solution was added and the reaction mixture was stirred for 3 h at 40° C. and then filtered again. The reaction mixture was neutralized with an aqueous solution of choline hydroxide (23% in water). To do so, 43.5 g (0.359 mol) choline hydroxide was required in order to achieve a pH value of 7.2 at 22° C. (the theoretical amount of 0.406 mol choline hydroxide was not required, because roughly 10 mol % of di(2-ethylhexyl) sulfosuccinate sodium salt (with respect to theoretical amount of desired surfactant structures) has been lost due to adsorption at the ion exchange material or due to filtration). In a rotary evaporator the methoxy-2-propanol and water were removed under reduced vacuum (<10 mbar) at 60° C. One obtained 188.5 g of substance. As shown by $^1$H-NMR-spektroscopy in CDCl$_3$ and MeOD formation of the desired structure and complete exchange of counter ion occurred. To obtain a 50 wt.-% solution, 188.5 g of methoxy-2-propanol was added and the mixture was filtered through a Seitz K200 filter. One obtained 376 g of a reddish liquid, which contained 50 weight-% of the desired final structure (the desired product).

a') Di(2-ethylhexyl) sulfosuccinate Choline Salt

A column was filled with wet Amberlyst (Amberlyst 15 hydrogen form, provided by Fluka) to a height of roughly 20 cm. Bed volume was around 280 ml. In the column were 100 g of wet Amberlyst, which was flushed with 1120 g water (electronic grade) in order to remove colored side-products or residual amounts of sodium ions. Afterwards, the column was flushed with 560 g methoxy-2-propanol (electronic grade), in order to remove the water. Then, 94.9 g (0.118 mol, 1.0 eq) of the solution of Di(2-ethylhexyl) sulfosuccinate ammonium salt (54.6 weight-% in methoxy-2-propanol) was diluted with 112.3 g methoxy-2-propanol (electronic grade) to adjust an active content of 25% (weight-%). Then, this diluted solution was added dropwise within 32 min onto the column. Afterwards the column was flushed with 560 g methoxy-2-propanol (electronic grade).

The first 150 ml of liquid, which came out of the column, were not collected. After 20 min the fraction number 1 was collected: 170.84 g (it took roughly 30 min to collect this amount) and analyzed (2.1 wt.-% water content, 74.2 wt.-% methoxy-2-propanol according to quantitative gas chromatography, acid number: 25.6 mg KOH/g→0.0781 mol acid). Then, the fraction number 2 was collected: it took roughly 23 min and the fraction was analyzed (1.5 wt.-% water content, 83 wt.-% methoxy-2-propanol according to quantitative gas chromatography, acid number: 9.0 mg KOH/g→0.0264 mol acid). The fraction number 3 was collected too (270 ml, it took roughly 25 min) but it did not show presence of an acid, which does mean, that no free sulfonic acid was present (1.0 wt.-% water content, 96.8 wt.-% methoxy-2-propanol according to quantitative gas chromatography, acid number: 0 mg KOH/g→0 mol acid). According to the acid number the surfactant was transformed into the corresponding sulfonic acid and roughly 90 to 95 mol % (with respect to theoretical amount of desired surfactant structures) of the surfactant was collected. The rest is lost due to adsorption at the ion exchanger material. The column or the ion exchanger was regenerated with 3.3 liter hydrochloric acid (electronic grade) as 5 wt.-% solution in water/methoxy-2-propanol (90/10, electronic grade each) and finally flushed with 3 l water (electronic grade).

Fraction number 1 and 2 were combined and a sample out of it was liberated from the solvent (using a rotary evaporator) and analyzed: elementary analysis and 1H-NMR spectroscopy in MeOD and CDCl$_3$ showed, that transformation into free corresponding sulfonic acid took place to an extent of >95 mol % (with respect to theoretical amount of desired surfactant structures). Combination of fraction number 1 and 2 gave 335.0 g, which was neutralized in a 500 ml 4-necked round bottom flask at 22° C. with an aqueous solution of choline hydroxide (46 wt.-% in water). For 335.0 g of the combined fractions 26.08 g (0.0990 mol) choline hydroxide was needed, to adjust a pH-value of 7.06 at 22° C. (the theoretical amount of 0.118 mol was not required, due to loss of Di(2-ethylhexyl) sulfosuccinate ammonium salt due to adsorption onto the Amberlyst). The solution was filtered through a Seitz K150 filter. One obtained 336.5 g of a reddish liquid, which contained 15.4 weight-% of the desired structure (methoxy-2-propanol 78.2 wt.-% according to quantitative gas chromatography, water 6.4 wt.-% according to Karl-Fischer).

Under reduced pressure and at moderate temperature (60° C., 10 mbar) the water was removed by azeotropic distillation with methoxy-2-propanol. One obtained 102 g of a liquid, which was analyzed. It contained 51 weight-% of the desired structure, which was confirmed by $^1$H-NMR spectroscopy in MeOD and CDCl$_3$, 47.7 wt.-% methoxy-2-propanol and 0.3 wt.-% water. Water content was determined by Karl-Fischer analysis, while the active content was determined indirectly by determination of content of methoxy-2-propanol by quantitative gas chromatography and determination of the water content (as alternative complete removal of solvent under vacuum proofed the former described method to determine the active content). Finally the solution was filtered through a Seitz K150 filter. However, small amounts of salts mixed with product (~1 g) were separated. The solution was stored for 2 weeks at 10° C. The solution was clear and did not show any precipitation. Metal ion content was <10 ppm.

b) Di(3,5,5-trimethylhexyl) sulfosuccinate Choline Salt

A 4 liter 4-necked round bottom flask, equipped with blade agitator, PT100-thermo element, pH meter, reflux condenser, was charged with 1130 g methoxy-2-propanol and 273 g Amberlyst 15 (ion exchanger, acid form) was added at 20° C., while temperature increased to 28° C. during addition. 191.63 g (0.406 mol, 1.0 eq) di(3,5,5-trimethlyhexyl) sulfosuccinate sodium salt was dissolved in 898.8 g methoxy-2-propanol and filtered through a Seitz K900 filter in order to remove insoluble salts. After 15 min, within 20 min the mentioned 191.63 g (0.406 mol, 1.0 eq) di(3,5,5-trimethylhexyl) sulfosuccinate sodium salt dissolved in methoxy-2-propanol was added dropwise into the 4 liter 4-necked round bottom flask. Reaction mixture stirred for 4 h at 40° C. and was filtered through a Seitz K900 filter in order to remove insoluble salts.

In a 4 liter 4-necked round bottom flask additional 560 g methoxy-2-propanol were added and 135 g of Amberlyst 15 was added afterwards. Then, the above mentioned filtered solution was added and the reaction mixture was stirred for 3 h at 40° C. and then filtered again. The reaction mixture was neutralized with an aqueous solution of choline hydroxide (23 wt.-% in water). To do so, 43.5 g (0.359 mol) choline hydroxide was required in order to achieve a pH value of 7.2 at 22° C. (the theoretical amount of 0.406 mol choline hydroxide was not required, because roughly 10 mol % of di(3,5,5-trimethylhexyl) sulfosuccinate sodium salt (with respect to theoretical amount of desired surfactant structures) has been lost due to adsorption at the ion exchange material or due to filtration). In a rotary evaporator the methoxy-2-propanol and water were removed under reduced vacuum (<10 mbar) at 60° C. One obtained 190.7 g of substance. As shown by $^1$H-NMR-spektroscopy in CDCl$_3$ and MeOD formation of the desired structure and complete exchange of counter ion occurred. To obtain a 50 wt.-% solution, 190.7 g of methoxy-2-propanol was added and the mixture was filtered through a Seitz K200 filter. One obtained 368.04 g of a reddish liquid, which contained 50 weight-% of the desired final structure (the desired product).

b') Di(3,5,5-trimethylhexyl) sulfosuccinate Choline Salt

A column was filled with wet Amberlyst (Amberlyst 15 hydrogen form, provided by Fluka) to a height of roughly 20 cm. Bed volume was around 280 ml. In the column were 100 g of wet Amberlyst, which was flushed with 1120 g water (electronic grade) in order to remove colored side-products or residual amounts of sodium ions. Afterwards, the column was flushed with 560 g methoxy-2-propanol (electronic grade), in order to remove the water. Then, 102.3 g (0.118 mol, 1.0 eq) of the solution of Di(3,5,5-trimethylhexyl) sulfosuccinate ammonium salt (53.7 weight-% in methoxy-2-propanol) was diluted with 117.5 g methoxy-2-propanol (electronic grade) to adjust an active content of 25% (weight-%). Then, this diluted solution was added dropwise within 32 min onto the column. Afterwards the column was flushed with 560 g methoxy-2-propanol (electronic grade).

The first 150 ml of liquid, which came out of the column, were not collected. After 20 min the fraction number 1 was collected: 171.77 g (it took roughly 30 min to collect this amount) and analyzed (2.2 wt.-% water content, 74.2 wt.-% methoxy-2-propanol according to quantitative gas chromatography, acid number: 24.9 mg KOH/g→0.0762 mol acid). Then, the fraction number 2 was collected: it took roughly 23 min and the fraction was analyzed (1.6 wt.-% water content, 86 wt.-% methoxy-2-propanol according to quantitative gas chromatography, acid number: 10.0 mg KOH/g→0.0337 mol acid). The fraction number 3 was collected too (260 ml, it took roughly 20 min) but it did not show presence of an acid, which does mean, that no free sulfonic acid was present (0.8 wt.-% water content, 93.8 wt.-% methoxy-2-propanol according to quantitative gas chromatography, acid number: 0 mg KOH/g→0 mol acid). According to the acid number the surfactant was transformed into the corresponding sulfonic acid and roughly 93 mol % (with respect to theoretical amount of desired surfactant structures) collected. The rest is lost due to adsorption at the ion exchanger material. The column or the ion exchanger was regenerated with 3.3 liter hydrochloric acid (electronic grade) as 5 wt.-% solution in water/methoxy-2-propanol (90/10, electronic grade each) and finally flushed with 3 l water (electronic grade).

Fraction number 1 and 2 were combined and a sample out of it was liberated from the solvent (using a rotary evaporator) and analyzed: elementary analysis and 1H-NMR spectroscopy in MeOD and CDCl$_3$ showed, that transformation into free corresponding sulfonic acid took place to an extent of >95 mol % (with respect to theoretical amount of desired surfactant structures). Combination of fraction number 1 and 2 gave 333.2 g, which was neutralized in a 500 ml 4-necked round bottom flask at 22° C. with an aqueous solution of choline hydroxide (46 wt.-% in water). For 333.2 g of the combined fractions 25.58 g (0.0971 mol) choline hydroxide was needed, to adjust a pH-value of 7.06 at 22° C. (the theoretical amount of 0.118 mol was not required, due to loss of Di(3,5,5-trimethylhexyl) sulfosuccinate ammonium salt due to adsorption onto the Amberlyst). The solution was filtered through a Seitz K150 filter. One obtained 332.4 g of a reddish liquid, which contained 15.2 weight-% of the desired structure (methoxy-2-propanol 78.8 wt.-% according to quantitative gas chromatography, water 6.0 wt.-% according to Karl-Fischer).

Under reduced pressure and at moderate temperature (60° C., 10 mbar) the water was removed by azeotropic distillation with methoxy-2-propanol. One obtained 101 g of a liquid, which was analyzed. It contained 50 weight-% of the desired structure, which was confirmed by $^1$H-NMR spectroscopy in MeOD and CDCl$_3$, 49.8 wt.-% methoxy-2-propanol and 0.2 wt.-% water. Water content was determined by Karl-Fischer analysis, while the active content was determined indirectly by determination of content of methoxy-2-propanol by quantitative gas chromatography and determination of the water content (as alternative complete removal of solvent under vacuum proofed the former described method to determine the active content). Finally the solution was filtered through a Seitz K150 filter. However, small amounts of salts mixed with product (~1 g) were separated. The solution was stored for 2 weeks at 10° C. The solution was clear and did not show any precipitation. Metal ion content was <10 ppm.

c) Di(isononyl) sulfosuccinate Choline Salt

A column was filled with wet Amberlyst (Amberlyst 15 hydrogen form, provided by Fluka) to a height of roughly 20 cm. Bed volume was around 280 ml. In the column were 100 g of wet Amberlyst, which was flushed with 1120 g water (eletonic grade) in order to remove colored side-products or residual amounts of sodium ions. Afterwards, the column was flushed with 560 g methoxy-2-propanol (electronic grade), in order to remove the water. Then, 97.5 g (0.118 mol, 1.0 eq) of the solution of Di(isononyl) sulfosuccinate ammonium salt (56.5 weight-% in methoxy-2-propanol) was diluted with 123 g methoxy-2-propanol (electronic grade) to adjust an active content of 25% (weight-%). Then, this diluted solution was added dropwise within 32 min onto the column. Afterwards the column was flushed with 560 g methoxy-2-propanol (electronic grade).

The first 150 ml of liquid, which came out of the column, were not collected. After 20 min the fraction number 1 was collected: 172.4 g (it took roughly 30 min to collect this amount) and analyzed (2.1 wt.-% water content, 75.1 wt.-% methoxy-2-propanol according to quantitative gas chromatography, acid number: 25.3 mg KOH/g→0.0778 mol acid). Then, the fraction number 2 was collected: it took roughly 23 min and the fraction was analyzed (1.5 wt.-% water content, 87 wt.-% methoxy-2-propanol according to quantitative gas chromatography, acid number: 9.0 mg KOH/g→0.0260 mol acid). The fraction number 3 was collected too (250 ml, it took roughly 20 min) but it did not show presence of an acid, which does mean, that no free sulfonic acid was present (0.9 wt.-% water content, 95.1 wt.-% methoxy-2-propanol according to quantitative gas chromatography, acid number: 0 mg KOH/g→0 mol acid). According to the acid number the surfactant was transformed into the corresponding sulfonic acid and roughly 94 mol % (with respect to theoretical amount of desired surfactant structures) collected. The rest is lost due to adsorption at the ion exchanger material. The column or the ion exchanger was regenerated with 3.3 liter hydrochloric acid (electronic grade) as 5 wt.-% solution in water/methoxy-2-propanol (90/10, electronic grade each) and finally flushed with 3 l water (electronic grade).

Fraction number 1 and 2 were combined and a sample out of it was liberated from the solvent (using a rotary evaporator) and analyzed: elementary analysis and 1H-NMR spectroscopy in MeOD and CDCl$_3$ showed, that transformation into free corresponding sulfonic acid took place to an extent of >95 mol % (with respect to theoretical amount of desired surfactant structures). Combination of fraction number 1 and 2 gave 334.3 g, which was neutralized in a 500 ml 4-necked round bottom flask at 22° C. with an aqueous solution of choline hydroxide (46 wt.-% in water). For 334.3 g of the combined fractions 25.29 g (0.0960 mol) choline hydroxide was needed, to adjust a pH-value of 7.06 at 22° C. (the theoretical amount of 0.118 mol was not required, due to loss of Di(isononyl) sulfosuccinate ammonium salt due to adsorption onto the Amberlyst). The solution was filtered through a Seitz K150 filter. One obtained 330.8 g of a reddish liquid, which contained 16.0 weight-% of the desired structure (methoxy-2-propanol 77.9 wt.-% according to quantitative gas chromatography, water 6.1 wt.-% according to Karl-Fischer).

Under reduced pressure and at moderate temperature (60° C., 10 mbar) the water was removed by azeotropic distillation with methoxy-2-propanol. One obtained 102 g of a liquid, which was analyzed. It contained 52 weight-% of the desired structure, which was confirmed by $^1$H-NMR spectroscopy in MeOD and CDCl$_3$, 47.8 wt.-% methoxy-2-propanol and 0.2 wt.-% water. Water content was determined by Karl-Fischer analysis, while the active content was determined indirectly by determination of content of methoxy-2-propanol by quantitative gas chromatography and determination of the water content (as alternative complete removal of solvent under vacuum proofed the former described method to determine the active content). Finally the solution was filtered through a Seitz K150 filter. However, small amounts of salts mixed with product (~1 g) were separated. The solution was stored for 2 weeks at 20° C. The solution was clear and did not show any precipitation. Metal ion content was <10 ppm.

d) Di(2-propylheptyl) sulfosuccinate Choline Salt

A column was filled with wet Amberlyst (Amberlyst 15 hydrogen form, provided by Fluka) to a height of roughly 20 cm. Bed volume was around 280 ml. In the column were 100 g of wet Amberlyst, which was flushed with 1120 g water (electronic grade) in order to remove colored side-products or residual amounts of sodium ions. Afterwards, the column was flushed with 560 g methoxy-2-propanol (electronic grade), in order to remove the water. Then, 93.5 g (0.118 mol, 1.0 eq) of the solution of Di(2-propylheptyl) sulfosuccinate ammonium salt (62.5 weight-% in methoxy-2-propanol) was diluted with 140.1 g methoxy-2-propanol (electronic grade) to adjust an active content of 25% (weight-%). Then, this diluted solution was added dropwise within 32 min onto the column. Afterwards the column was flushed with 560 g methoxy-2-propanol (electronic grade).

The first 150 ml of liquid, which came out of the column, were not collected. After 20 min the fraction number 1 was collected: 174.8 g (it took roughly 30 min to collect this amount) and analyzed (2.3 wt.-% water content, 78.2 wt.-% methoxy-2-propanol according to quantitative gas chromatography, acid number: 23.7 mg KOH/g→0.0740 mol acid). Then, the fraction number 2 was collected: it took roughly 23 min and the fraction was analyzed (1.4 wt.-% water content, 87 wt.-% methoxy-2-propanol according to quantitative gas chromatography, acid number: 11.0 mg KOH/g→0.0306 mol acid). The fraction number 3 was collected too (250 ml, it took roughly 20 min) but it did not show presence of an acid, which does mean, that no free sulfonic acid was present (0.8 wt.-% water content, 93.8 wt.-% methoxy-2-propanol according to quantitative gas chromatography, acid number: 0 mg KOH/g→0 mol acid). According to the acid number the surfactant was transformed into the corresponding sulfonic acid and roughly 93 mol-% collected (with respect to theoretical amount of desired surfactant structures). The rest is lost due to adsorption at the ion exchanger material. The column or the ion exchanger was regenerated with 3.3 liter hydrochloric acid (electronic grade) as 5 wt.-% solution in water/methoxy-2-propanol (90/10, electronic grade each) and finally flushed with 3 l water (electronic grade).

Fraction number 1 and 2 were combined and a sample out of it was liberated from the solvent (using a rotary evaporator) and analyzed: elementary analysis and 1H-NMR spectroscopy in MeOD and CDCl$_3$ showed, that transformation into free corresponding sulfonic acid took place to an extent of >95 mol % (with respect to theoretical amount of desired surfactant structures). Combination of fraction number 1 and 2 gave 330.7 g, which was neutralized in a 500 ml 4-necked round bottom flask at 22° C. with an aqueous solution of choline hydroxide (46 wt.-% in water). For 330.7 g of the combined fractions 25.40 g (0.0964 mol) choline hydroxide was needed, to adjust a pH-value of 7.06 at 22° C. (the theoretical amount of 0.118 mol was not required, due to loss of Di(2-propylheptyl) sulfosuccinate ammonium salt due to adsorption onto the Amberlyst). The solution was filtered through a Seitz K150 filter. One obtained 334.7 g of a reddish liquid, which contained 16.7 weight-% of the desired structure (methoxy-2-propanol 77.2 wt.-% according to quantitative gas chromatography, water 6.1 wt.-% according to Karl-Fischer).

Under reduced pressure and at moderate temperature (60° C., 10 mbar) the water was removed by azeotropic distillation with methoxy-2-propanol. One obtained 112 g of a liquid, which was analyzed. It contained 50.1 weight-% of the desired structure, which was confirmed by $^1$H-NMR spectroscopy in MeOD and CDCl$_3$, 49.7 wt.-% methoxy-2-propanol and 0.2 wt.-% water. Water content was determined by Karl-Fischer analysis, while the active content was determined indirectly by determination of content of methoxy-2-propanol by quantitative gas chromatography and determination of the water content (as alternative complete removal of solvent under vacuum proofed the former described method to determine the active content). Finally the solution was filtered through a Seitz K150 filter. However, small amounts of salts mixed with product (~1 g) were separated. Metal ion content was <10 ppm.

In synthesis procedures described above (and below) methoxy-2-propanol stands for 1-methoxy-2-propanol.

An alternative access to structures described in chapter 4 (e.g. structure 4b) is to treat corresponding maleic/fumaric acid diesters described in chapter 1 (e.g. structure 1 b') with choline hydrogen sulfite. Choline hydrogen sulfite can be prepared by reaction of an aqueous solution of choline hydroxide or choline hydrogen carbonate with *sulphurous* acid or sulfur dioxide. *Sulphurous* acid or sulfur dioxide is added to the aqueous solution of choline hydroxide or choline hydrogen carbonate till a pH value between 4 and 5 (e.g. ~4.5) is achieved. The resulting aqueous solution of choline hydrogen sulfite can optionally be concentrated by removal of water under reduced pressure (for example >50 wt.-% of choline hydrogen sulfite in water). The addition of choline hydrogen sulfite to the male-ic/fumaric acid diesters can be done in such a way, that 1.0-2.5 eq (more preferably 1.0-1.3 eq) of choline hydrogen sulfite per 1.0 eq diester are used. Reaction can be done in water and a second solvent (e.g. 1-methoxy-2-propanol, 2-butanol or 2-propanol, wherein 2-propanol is preferred). Temperature can vary between 40 and 105° C. After complete conversion of the diester to the desired product, the water can be removed by azeotropic distillation (using methoxy-2-propanol or 2-butanol or 2-propanol respectively) and reduced pressure. One can obtain a surfactant concentrate (>30 wt.-% surfactant content), which can be optionally filtered.

In general, other ammonium salts described herein above but whose synthesis is not described) can be made in an analogue way as ammonium salts whose synthesis is described above. In case of triester based surfactants according to the invention, one would not start by using an acid anhydride but by using the corresponding carboxylic acid (e.g. tricarballic acid) and esterifying it with the desired alcohols (e.g. 1 eq. tricarballic acid mixed together with 3 eq. alcohol in the presence of a catalytically effective amount of an acid catalyst such as p-toluene sulfonic acid, reaction water would be removed at elevated temperature using toluene as a solvent and a water separator). Addition of hydrogen sulfite optionally followed by a cation exchange step would be done as described before.

The invention claimed is:

1. A method for cleaning or rinsing a product, the method comprising:
    cleaning or rinsing the product with a composition comprising an ammonium salt of one or more compounds selected from the group consisting of
    a sulfobutanedioic acid diester, (sulfomethyl)-butanedioic acid diester, a methyl-sulfobutanedioic acid diester, a sulfoglutaric acid diester, and a sulfotricarballic acid triester,
    wherein the product comprises a substrate and a patterned material layer, supported thereon, the patterned material layer having line-space structures with a line width of 50 nm and below.

2. The method according to claim 1, wherein at least one of the ammonium salt(s) comprises at least one ammonium cation selected from the group consisting of tris(2-hydroxyethyl)ammonium, bis(2-hydroxyethyl)ammonium, tris(2-hydroxyethyl)methylammonium, bis(2-hydroxyethyl)dimethylammonium, 2-hydroxyethyl-trimethylammonium, 2-hydroxyethyl-triethylammonium, 2-hydroxypropyl-trimethylammonium, bis(2-hydroxypropyl)dimethylammonium, and tris(2-hydroxypropyl)methylammonium.

3. The method according to claim 1, wherein at least one of the ammonium salt(s) comprises an anion having two or three ester groups of formula (1):

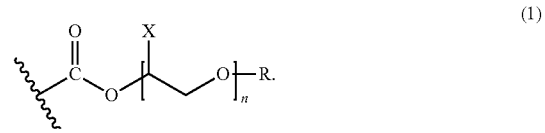

wherein in each ester group of formula (1), independently of each other,
n is 0, 1 or 2,
X is hydrogen, methyl or ethyl,
R is selected from the group consisting of an unsubstituted branched alkyl, an unsubstituted linear alkyl, a substituted linear alkyl, a substituted branched alkyl, an unsubstituted branched alkenyl, an unsubstituted linear alkenyl, a substituted linear alkenyl, and a substituted branched alkenyl.

4. The method according to claim 3,
wherein R is selected from the group consisting of the unsubstituted branched alkyl and the unsubstituted branched alkenyl.

5. The method according to claim 3,
wherein R is independently of each other selected from the group consisting of
3,5,5-trimethylhexyl, 2-ethylhexyl, 3,3-dimethylbutyl, 2,4,4-trimethylpentyl, 2,2-dimethylpropyl, 2-propylheptyl, isononyl, isodecyl, isotridecyl, 2,6-dimethyl-4-heptyl, 1-iso-butyl-3,5-dimethylhexyl, 5,7,7-trimethyl-2-(1,3,3-trimethylbutyl)octyl, 2-propylpentyl, 1-ethyl-2-methylpentyl and 6-methyl-2-heptyl.

6. The method according to claim 1,
wherein the composition comprises;
an ammonium salt comprising a trimethyl-2-hydroxyethylammonium cation,
and
at least one anion selected from the group consisting of:

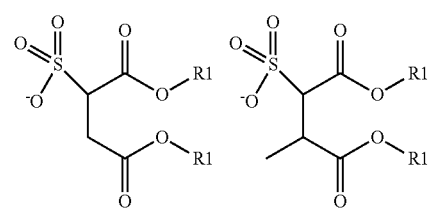

-continued

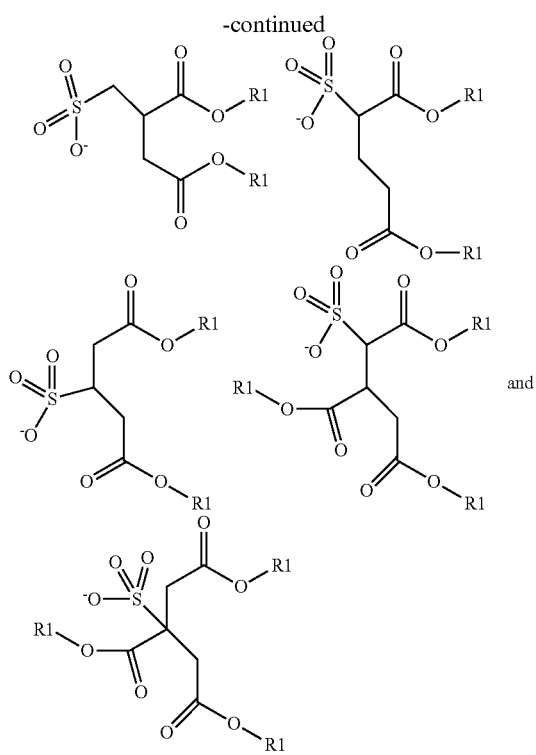

wherein R1 is selected from the group consisting of 3,5,5-trimethylhexyl, 2-ethylhexyl, 3,3-dimethyl-2-butyl, and 2,4,4-trimethylpentyl.

7. The method according to claim 1,
wherein the total amount of ammonium cations of the ammonium salt is in the range of from $2 \times 10^{-5}$ to $4 \times 10^{-2}$ mol/L,
and/or
the total amount of anions of the ammonium salt is in the range of from $2 \times 10^{-5}$ to $4 \times 10^{-2}$ mol/L,
wherein the anions comprise two or three ester groups of formula (1):

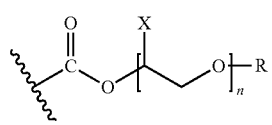

wherein in each ester group of formula (1), independently of each other,
n is 0, 1 or 2,
X is hydrogen, methyl or ethyl,
R is selected from the group consisting of an unsubstituted branched alkyl, an unsubstituted linear alkyl, a substituted linear alkyl, a substituted branched alkyl, an unsubstituted branched alkenyl, an unsubstituted linear alkenyl, a substituted linear alkenyl, and a substituted branched alkenyl,
and/or
wherein the composition has an equilibrium surface tension of less than 35 mN/m, determined at a critical micelle concentration.

8. The method according to claim 1, wherein the patterned material layer has line-space structures with a line width of 32 nm or below.

9. A method for producing a cleaned or rinsed product, the method comprising:
preparing or providing a product comprising a substrate and a patterned material layer, supported thereon, the patterned material layer having line-space structures with a line width of 50 nm or below,
preparing or providing a composition,
and
cleaning or rinsing the product with the composition, thereby producing the cleaned or rinsed product
wherein the composition comprises an ammonium salt of one or more compounds selected from the group consisting of a sulfobutanedioic acid diester, a (sulfomethyl)-butanedioic acid diester, a methyl-sulfobutanedioic acid diester, a sulfoglutaric acid diester, and a sulfotricarballic acid triester.

10. The method according to claim 9, further comprising:
providing a substrate with an immersion photoresist, EUV photoresist or eBeam photoresist layer,
exposing the immersion photoresist, EUV photoresist or eBeam photoresist layer to actinic radiation through a mask with or without an immersion liquid, thereby producing an exposed photoresist layer,
developing the exposed photoresist layer with a developer solution to obtain a pattern having line-space structures with a line width of 50 nm or below, thereby producing a product comprising a substrate and a patterned material layer, supported thereon, the patterned material layer having line-space structures with a line width of 50 nm or below,
cleaning or rinsing the product with the composition, thereby producing a cleaned or rinsed product,
and optionally
drying the cleaned or rinsed product.

11. The method according to claim 9, wherein
the patterned material layer has line-space structures with a line width of 32 nm or below.

12. A formulation, comprising:
water
and
an ammonium salt,
and optionally
a solvent compound
wherein the formulation has
a color of HAZEN number below 1000,
and/or
a turbidity in the range of from 0.08 to 10 NTU, and
wherein the ammonium salt is an ammonium salt of one or more compounds selected from the group consisting of
a sulfobutanedioic acid diester, a (sulfomethyl)-butanedioic acid diester, a methyl-sulfobutanedioic acid diester, a sulfoglutaric acid diester, and a sulfotricarballic acid triester.

13. The formulation according to claim 12,
wherein the ammonium salt of one or more compounds is ammonium salt of one or more compounds selected from the group consisting of
a (sulfomethyl)-butanedioic acid diester, a methyl-sulfobutanedioic acid diester, a sulfoglutaric acid diester, and a sulfotricarballic acid triester.

14. The formulation according to claim 12,
wherein at least one of the ammonium salt(s) comprises at least one ammonium cation selected from the group consisting of
tris(2-hydroxyethyl)ammonium, bis(2-hydroxyethyl)ammonium, tris(2-hydroxyethyl)methylammonium, bis (2-hydroxyethyl)dimethylammonium, 2-hydroxyethyl-trimethylammonium, 2-hydroxyethyl-triethylammonium, 2-hydroxypropyl-trimethylammonium, bis(2-hydroxypropyl) dimethylammonium, and tris(2-hydroxypropyl) methylammonium.

15. The formulation according to claim 12,
wherein at least one of the ammonium salt(s) comprises at least one ammonium cation selected from the group consisting of tris(2-hydroxyethyl)ammonium, bis(2-hydroxyethyl)ammonium, tris(2-hydroxyethyl)methylammonium, bis(2-hydroxyethyl)dimethylammonium, 2-hydroxyethyl-trimethylammonium, 2-hydroxyethyl-triethylammonium, 2-hydroxypropyl-trimethylammonium, bis(2-hydroxypropyl)dimethylammonium, and tris(2-hydroxypropyl)methylammonium, and
wherein the ammonium salt of one or more compounds is an ammonium salt of one or more compounds selected from the group consisting of a (sulfomethyl)-butanedioic acid diester, a methyl-sulfobutanedioic acid diester, a sulfoglutaric acid diester, and a sulfotricarballic acid triester.

16. The formulation according to claim 12, wherein the formulation is suitable for cleaning or rinsing a product comprising a substrate and a patterned material layer, supported thereon, the patterned material layer having line-space structures with a line width of 50 nm and below.

17. The formulation according to claim 12, further comprising: an organic solvent compound selected from the group consisting of an alcohol having a total number of 1 to 8 carbon atoms, an alkyl ethylene glycol, an alkyldiethylene glycol, an alkyltriethylene glycol, an alkylpropylene glycol, an alkyl dipropylene glycol and an alkyl tripropylene glycol
wherein an alkyl in each case has a total number of carbon atoms in the range of from 1 to 7,
and/or
comprising: less than 5 ppm metal cations, based on the total weight of the formulation.

18. A method for making the formulation according to claim 12, the method comprising:
a) synthesizing the ammonium salt by a procedure comprising adding hydrogen sulfite anions to double-bonds of one or more α,β-unsaturated esters, thereby producing one or more corresponding diester or triester anions selected from the group consisting of a sulfobutanedioic acid diester anion, a (sulfomethyl)-butanedioic acid diester anion, a methyl-sulfobutanedioic acid diester anion, a sulfoglutaric acid diester anion, and a sulfotricarballic acid triester anion,
b) mixing the ammonium salt with water and/or one or more organic solvents in order to obtain a formulation,
c) optionally filtering the formulation through a filter with pore size of <30 nm in diameter,
wherein the one or more organic solvents are selected from the group consisting of an alcohol having a total number of 1 to 8 carbon atoms, an alkyl ethylene glycol, an alkyldiethylene glycol, an alkyltriethylene glycol, an alkylpropylene glycol, an alkyl dipropylene glycol and an alkyl tripropylene glycol, and
wherein an alkyl in each case has a total number of carbon atoms in the range of from 1 to 7.

19. The method according to claim 18,
wherein in the synthesizing a)
counter-cations of the hydrogen sulfite anions are ammonium cations, so that after the adding an ammonium salt is constituted, wherein the ammonium cations are selected from the group consisting of tris(2-hydroxyethyl)ammonium, bis(2-hydroxyethyl)ammonium, tris(2-hydroxyethyl)methylammonium, bis(2-hydroxyethyl)dimethylammonium, 2-hydroxyethyl-trimethylammonium, 2-hydroxyethyl-triethylammonium, 2-hydroxypropyl-trimethylammonium, bis(2-hydroxypropyl) dimethylammonium, and tris(2-hydroxypropyl) methylammonium and wherein the ammonium salt is an ammonium salt of one or more compounds selected from the group consisting of a sulfobutanedioic acid diester, a (sulfomethyl)-butanedioic acid diester, a methyl-sulfobutanedioic acid diester, a sulfoglutaric acid diester, and a sulfotricarballic acid triester,
or
counter-cations of the hydrogen sulfite anions are not ammonium cations, and the counter-cations are exchanged against ammonium cations in a subsequent step, so that an ammonium salt is constituted, wherein the ammonium salt comprises at least one ammonium cation selected from the group consisting of tris(2-hydroxyethyl)ammonium, bis(2-hydroxyethyl)ammonium, tris(2-hydroxyethyl)methylammonium, bis(2-hydroxyethyl)dimethylammonium, 2-hydroxyethyl-trimethylammonium, 2-hydroxyethyl-triethylammonium, 2-hydroxypropyl-trimethylammonium, bis(2-hydroxypropyl) dimethylammonium, and tris(2-hydroxypropyl) methylammonium,
or
counter-cations of the hydrogen sulfite anions are not ammonium cations, and the counter-cations are exchanged against ammonium cations in a subsequent step, so that an ammonium salt is constituted, wherein the ammonium salt is an ammonium salt of one or more compounds selected from the group consisting of a sulfobutanedioic acid diester, a (sulfomethyl)-butanedioic acid diester, a methyl-sulfobutanedioic acid diester, a sulfoglutaric acid diester, and a sulfotricarballic acid triester.

20. The method according to claim 19, wherein in a subsequent step
the counter-cations are exchanged against the ammonium cations, so that the ammonium salt is constituted constituted.

21. The method according to claim 18, wherein the one or more corresponding diester or triester anions are selected from the group consisting of
a (sulfomethyl)-butanedioic acid diester anion, a methyl-sulfobutanedioic acid diester anion, a sulfoglutaric acid diester anion, and a sulfotricarballic acid triester anion.

* * * * *

UNITED STATES PATENT AND TRADEMARK OFFICE
CERTIFICATE OF CORRECTION

PATENT NO.       : 10,538,724 B2
APPLICATION NO.  : 15/743848
DATED            : January 21, 2020
INVENTOR(S)      : Christian Bittner et al.

It is certified that error appears in the above-identified patent and that said Letters Patent is hereby corrected as shown below:

On the Title Page

In Column 1, item (73), Assignee, Line 1, delete "BAFS" and insert -- BASF --, therefor.

In the Specification

In Column 3, Line 10 (approx.), delete "tetramethylammoniumhydroxid" and insert -- tetramethylammonium hydroxide --, therefor.

In Column 15, Line 31, delete "perfluorooctan" and insert -- perfluorooctane --, therefor.

In Column 20, Line 28 (approx.), delete "betain," and insert -- betaine, --, therefor.

In Column 20, Line 35, delete "cocoamidopropylamino" and insert -- cocamidopropylamino --, therefor.

In Column 30, Line 39 (approx.), delete "water" and insert -- water. --, therefor.

In Column 30, Lines 58-59, delete "trichloracetylisocyanate" and insert -- trichloroacetylisocyanate --, therefor.

In Column 30, Line 67 (approx.), delete "((F" and insert -- (F --, therefor.

In Column 30, Line 67 (approx.), delete "2))" and insert -- 2) --, therefor.

In Column 31, Line 3, delete "Kruess" and insert -- Kruss --, therefor.

In Column 32, Line 5, delete "Kruess" and insert -- Kruss --, therefor.

In Column 34, Line 45 (approx.), delete "100*" and insert -- 110*--, therefor.

Signed and Sealed this
Thirtieth Day of June, 2020

Andrei Iancu
*Director of the United States Patent and Trademark Office*

CERTIFICATE OF CORRECTION (continued)
U.S. Pat. No. 10,538,724 B2

In Column 40, Line 8, delete "FIG." and insert -- FIGS. --, therefor.

In Column 41, Line 1, delete "BARG" and insert -- BARC --, therefor.

In Column 42, Line 47, delete "spektroscopy" and insert -- spectroscopy --, therefor.

In Column 43, Line 8, delete "spektroscopy" and insert -- spectroscopy --, therefor.

In Column 43, Line 37, delete "spektroscopy" and insert -- spectroscopy --, therefor.

In Column 43, Line 66, delete "spektroscopy" and insert -- spectroscopy --, therefor.

In Column 44, Line 26 (approx.), delete "spektroscopy" and insert -- spectroscopy --, therefor.

In Column 44, Line 54 (approx.), delete "spektroscopy" and insert -- spectroscopy --, therefor.

In Column 45, Lines 11-12, delete "spektroscopy" and insert -- spectroscopy --, therefor.

In Column 45, Line 29, delete "spektroscopy" and insert -- spectroscopy --, therefor.

In Column 45, Lines 55-56, delete "spektroscopy" and insert -- spectroscopy --, therefor.

In Column 45, Line 66, delete "spektroscopy" and insert -- spectroscopy --, therefor.

In Column 46, Line 22, delete "spektroscopy" and insert -- spectroscopy --, therefor.

In Column 46, Line 39, delete "spektroscopy" and insert -- spectroscopy --, therefor.

In Column 46, Lines 62-63, delete "spektroscopy" and insert -- spectroscopy --, therefor.

In Column 47, Line 14 (approx.), delete "spektroscopy" and insert -- spectroscopy --, therefor.

In Column 47, Lines 40-41, delete "spektroscopy" and insert -- spectroscopy --, therefor.

In Column 47, Line 58, delete "spektroscopy" and insert -- spectroscopy --, therefor.

In Column 48, Line 33, delete "spektroscopy" and insert -- spectroscopy --, therefor.

In Column 49, Line 3, delete "spektroscopy" and insert -- spectroscopy --, therefor.

In Column 49, Line 45, delete "spektroscopy" and insert -- spectroscopy --, therefor.

In Column 50, Line 31 (approx.), delete "1H-NMR" and insert -- $^{1}$H-NMR --, therefor.

In Column 51, Line 10, delete "trimethlyhexyl)" and insert -- trimethylhexyl) --, therefor.

CERTIFICATE OF CORRECTION (continued)
U.S. Pat. No. 10,538,724 B2

In Column 51, Line 35, delete "spektroscopy" and insert -- spectroscopy --, therefor.

In Column 52, Line 21 (approx.), delete "1H-NMR" and insert -- $^1$H-NMR --, therefor.

In Column 52, Line 64, delete "(electonic" and insert -- (electronic --, therefor.

In Column 53, Line 35, delete "1H-NMR" and insert -- $^1$H-NMR --, therefor.

In Column 54, Line 50, delete "1H-NMR" and insert -- $^1$H-NMR --, therefor.

In Column 55, Line 32, delete "male-ic" and insert -- maleic --, therefor.

In the Claims

In Column 55, Line 64, Claim 1, after "diester," should read -- a --.

In Column 58, Line 43, Claim 12, delete "compound" and insert -- compound, --, therefor.

In Column 60, Line 52 (approx.), Claim 20, after "is" delete "constituted".